United States Patent [19]

Yoshida et al.

[11] Patent Number: 5,661,678
[45] Date of Patent: Aug. 26, 1997

[54] SEMICONDUCTOR MEMORY DEVICE USING DYNAMIC TYPE MEMORY CELLS

[75] Inventors: Masako Yoshida; Yukihito Oowaki; Takehiro Hasegawa, all of Yokohama; Kiyofumi Ochii, Tokyo; Masayuki Koizumi, Yokohama, all of Japan

[73] Assignee: Kabushiki Kaisha Toshiba, Kawasaki, Japan

[21] Appl. No.: 570,966

[22] Filed: Dec. 12, 1995

[30] Foreign Application Priority Data

Dec. 12, 1994 [JP] Japan .................................... 6-307323
Mar. 7, 1995 [JP] Japan .................................... 7-047550

[51] Int. Cl.$^6$ ........................................................ G11C 7/00
[52] U.S. Cl. ............................ 365/149; 365/63; 365/51
[58] Field of Search ................................ 365/149, 63, 51, 365/189.01

[56] References Cited

U.S. PATENT DOCUMENTS

| | | | |
|---|---|---|---|
| 5,058,058 | 10/1991 | Yasuda et al. | 365/63 |
| 5,091,887 | 2/1992 | Asakura | 365/63 |
| 5,309,393 | 5/1994 | Sakata et al. | 365/149 |
| 5,418,750 | 5/1995 | Shiratake et al. | 365/206 |

FOREIGN PATENT DOCUMENTS 61-34790  2/1986  Japan .

OTHER PUBLICATIONS

Katsutaka Kimura, et al. ISSCC Digest of Technical Papers 34 (1991) pp. 106–108.
Takehiro Hasegawa, et al. ISSCC Digest of Technical Papers 36 (1993) pp. 46–47.

Primary Examiner—David C. Nelms
Assistant Examiner—Vu A. Le
Attorney, Agent, or Firm—Oblon, Spivak, McClelland, Maier & Neustadt, P.C.

[57] ABSTRACT

A semiconductor memory device comprises a memory cell array including NAND type memory cell units arranged in matrix and having a plurality of dynamic type memory cells connected in series, a plurality of word lines, a plurality of bit lines arranged within the memory cell array, the plurality of bit lines including a bit line pairs which are arranged adjacent to each other or between which at least one bit line is interposed, and a plurality of sense amplifiers of a folded bit line type, provided in each of the plurality of bit line pairs, in which the memory cells are provided in positions corresponding to intersections of the bit lines and the word lines, and complementary data are written to two memory cells connected to each of the plurality of bit line pairs and one word line, and the two memory cells store one-bit data.

16 Claims, 30 Drawing Sheets

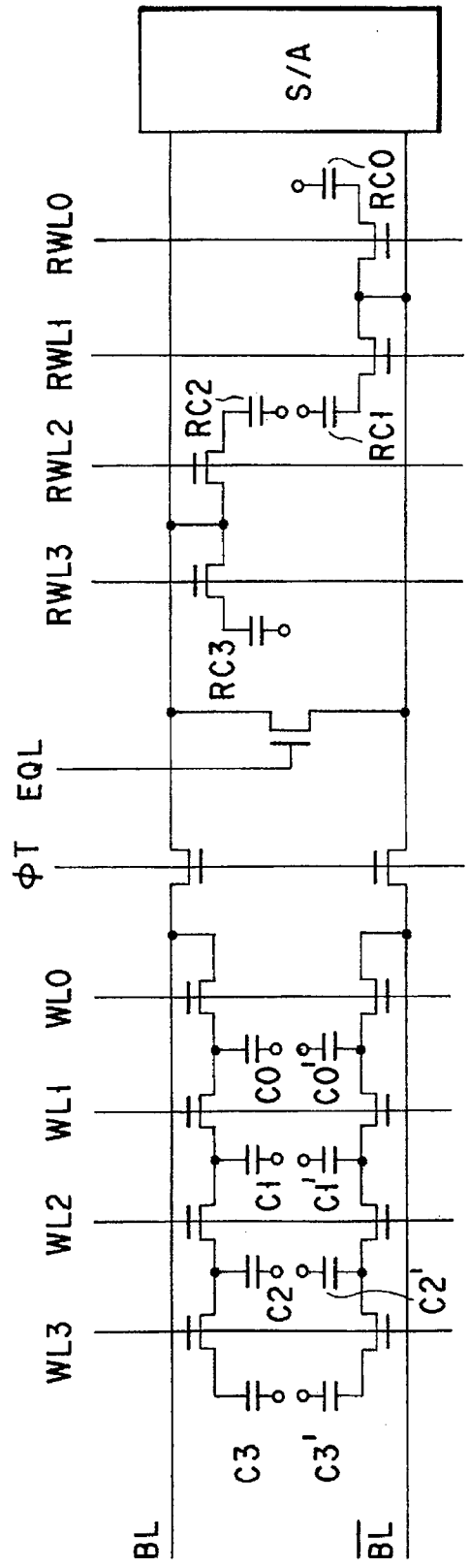
F I G. 3

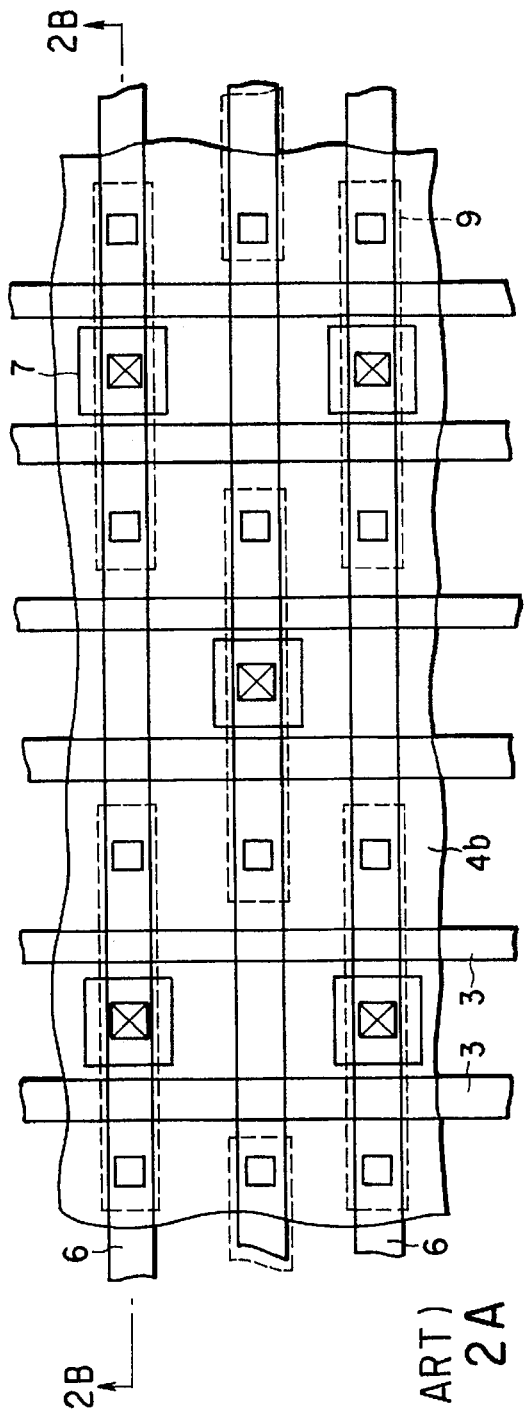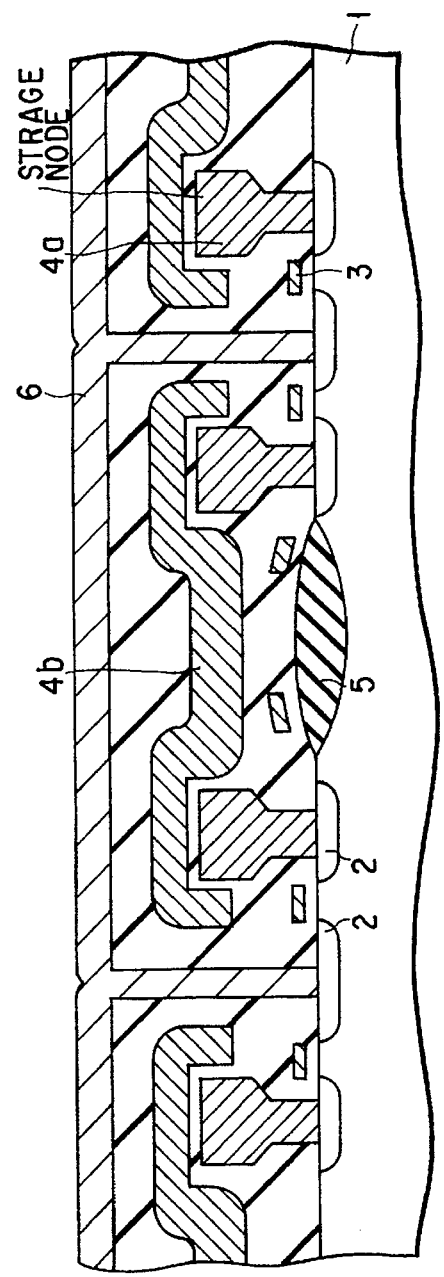
(PRIOR ART)
FIG. 2A
(PRIOR ART)
FIG. 2B

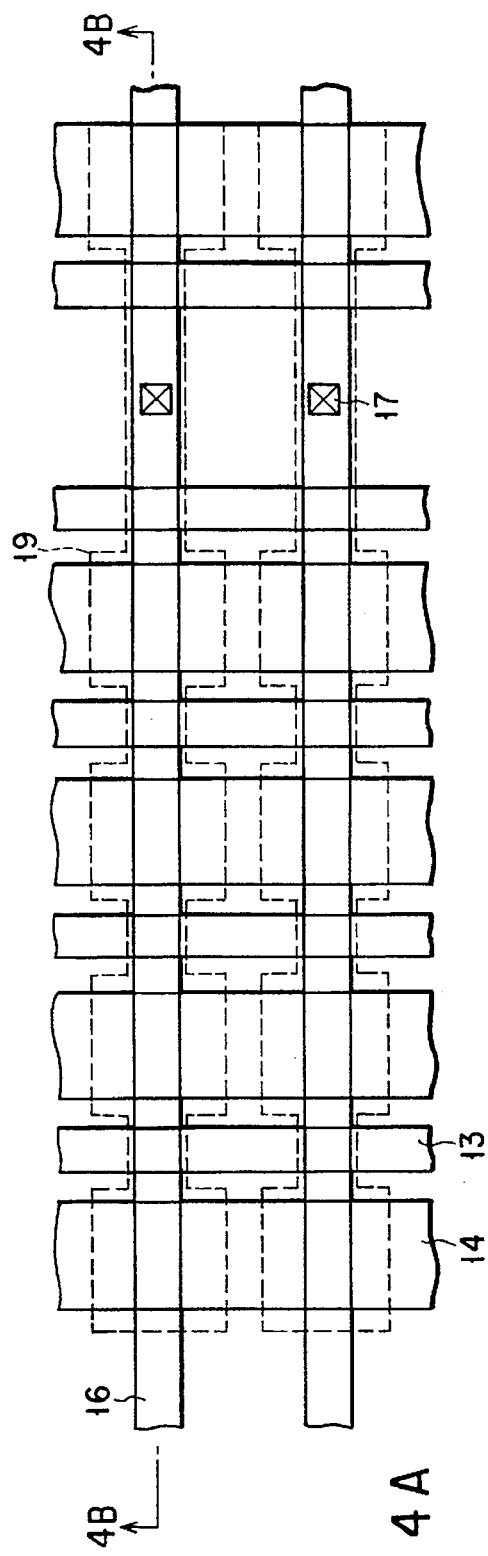
F I G. 4A
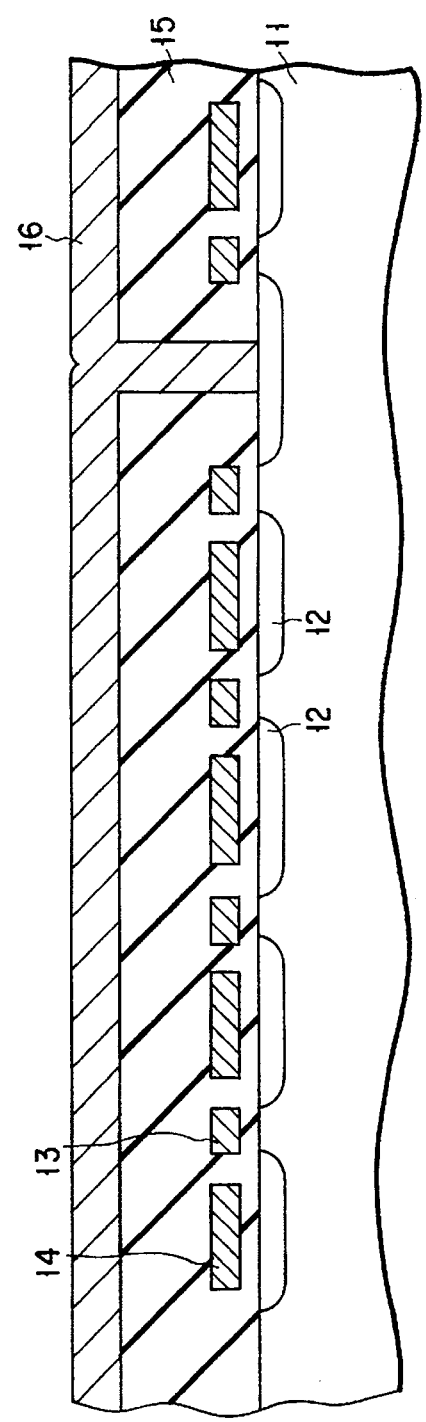
F I G. 4B

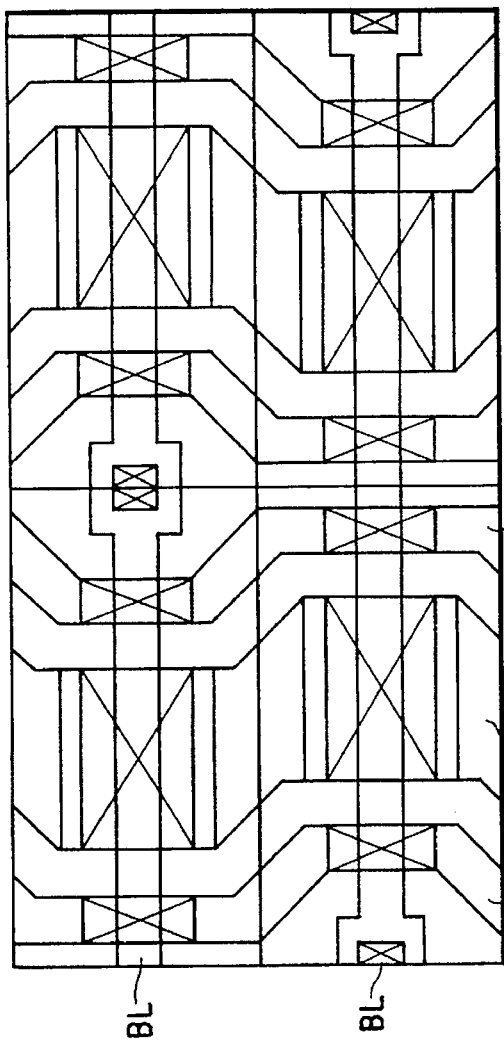
(PRIOR ART) FIG. 5
231.0 μm² (100.0%)
4 CELL (4 BIT)
F = 1 μm
CELL 4 × 3.5
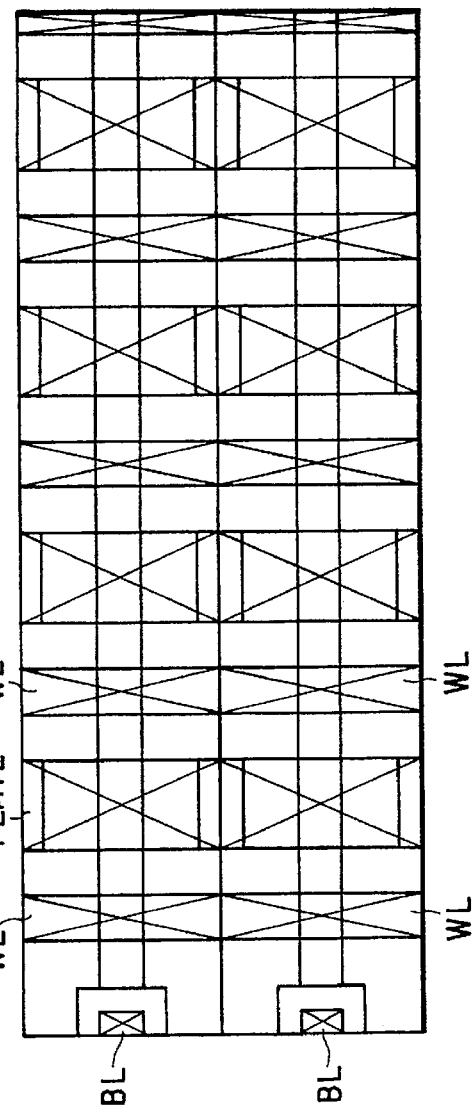
FIG. 6
202.5 um² (87.7%)
8 CELL (4 BIT)

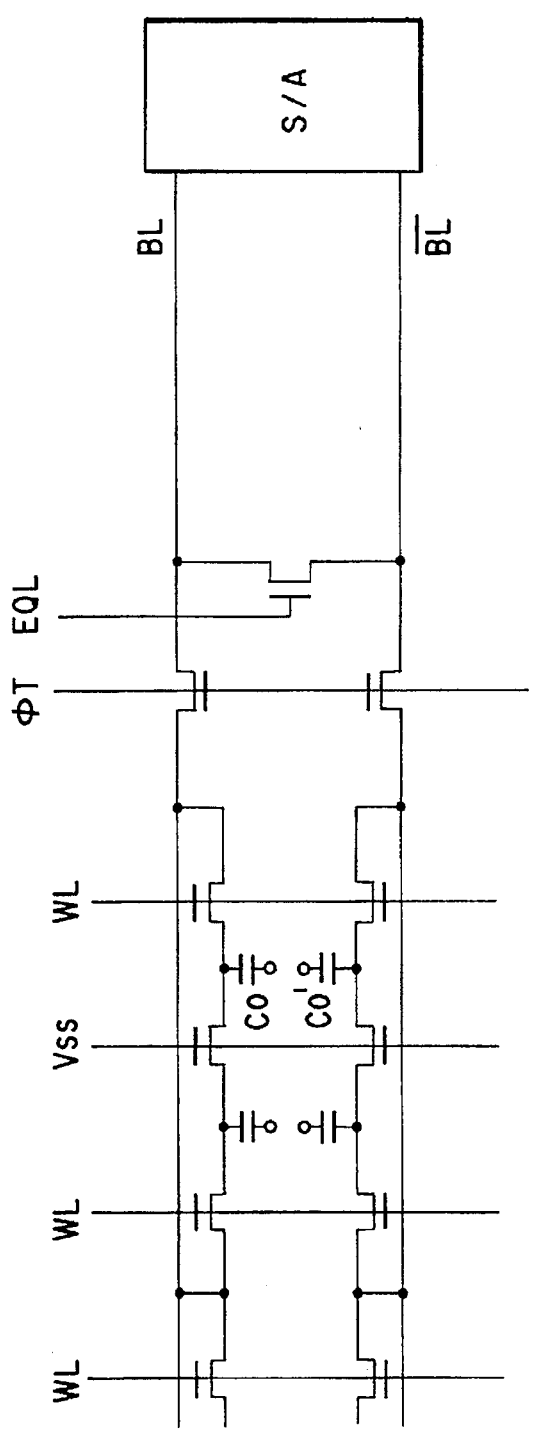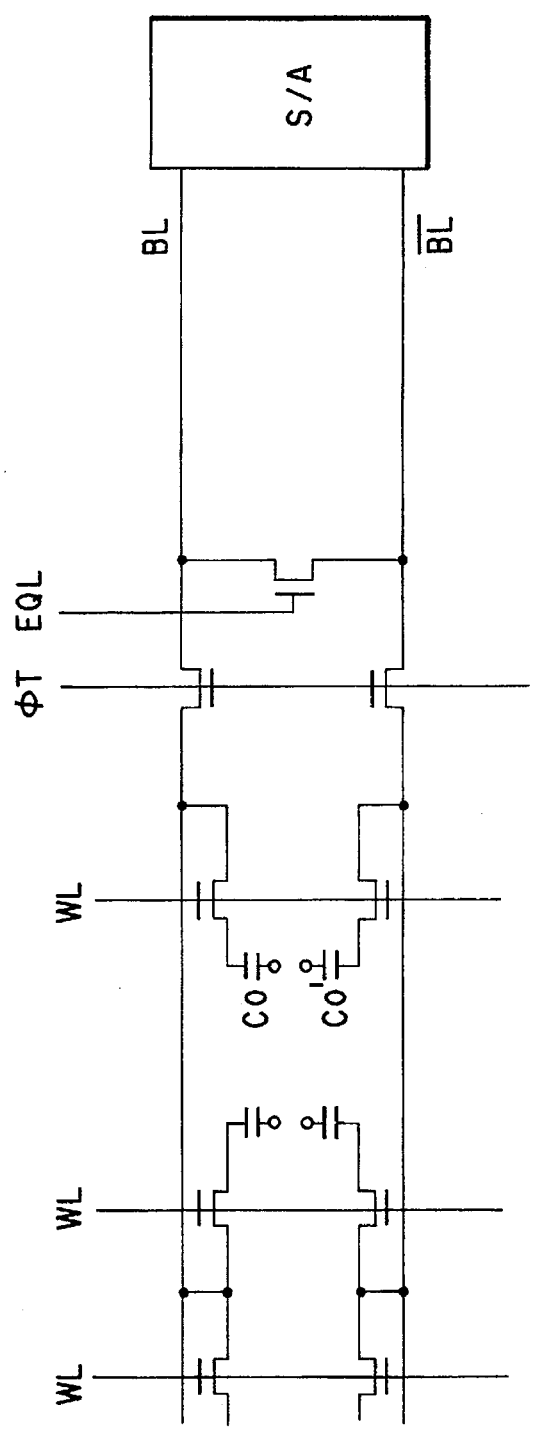
F I G. 7
F I G. 9

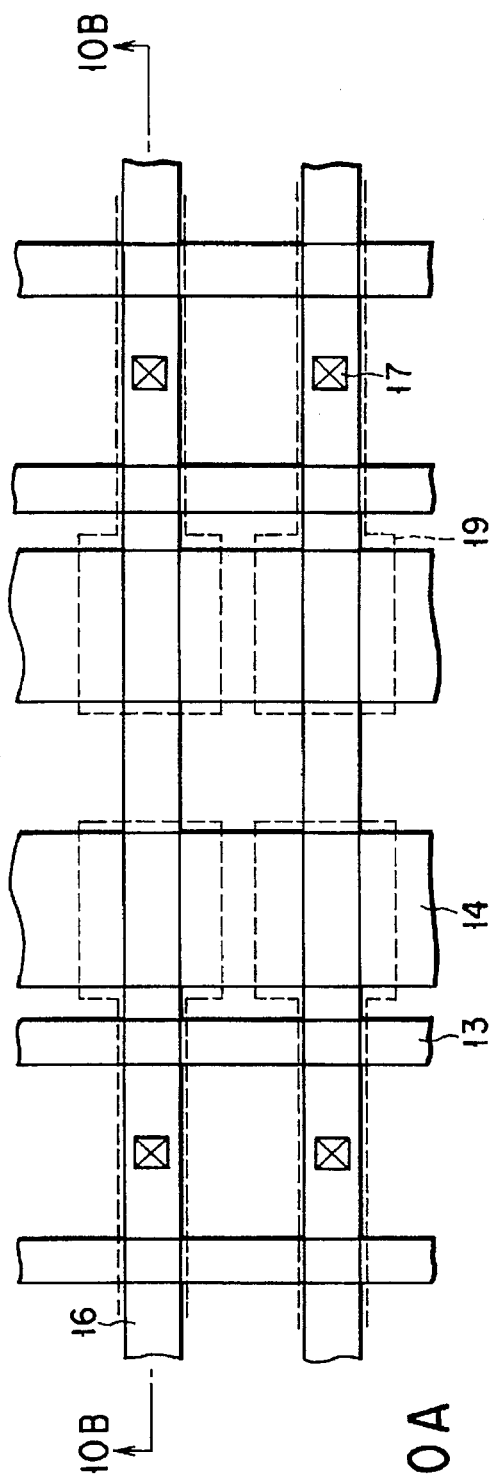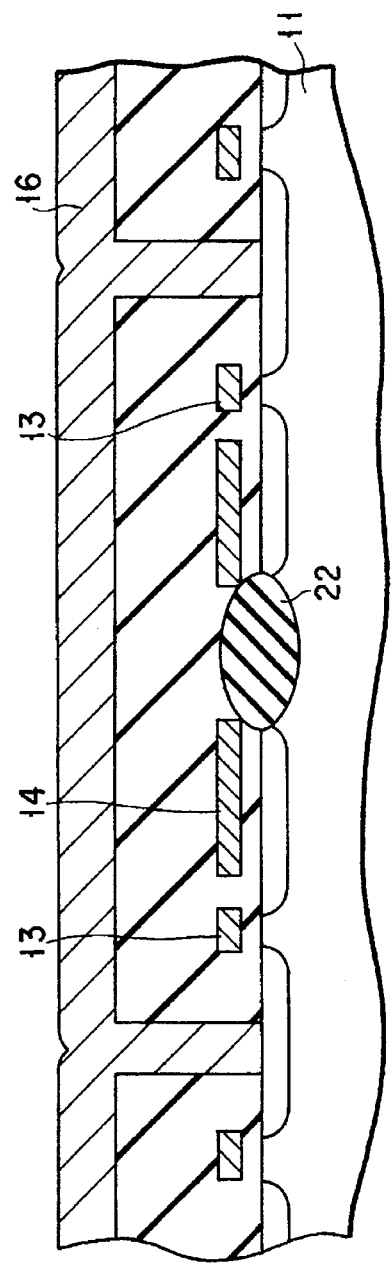
FIG. 10A
FIG. 10B

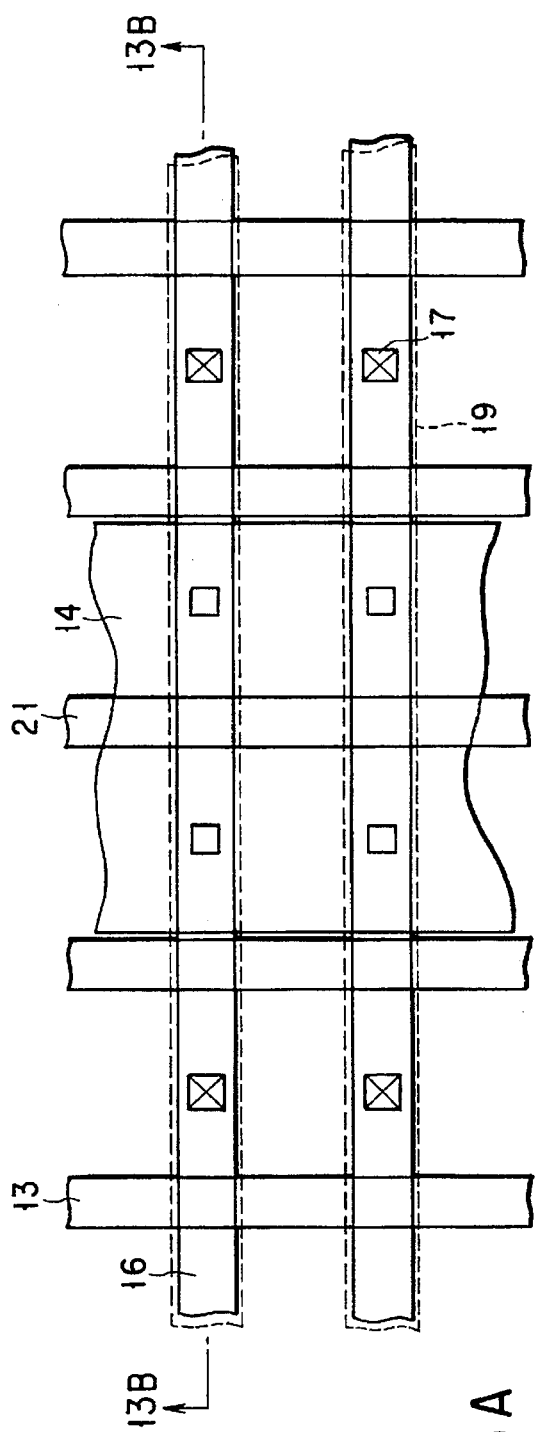
F I G. 13A
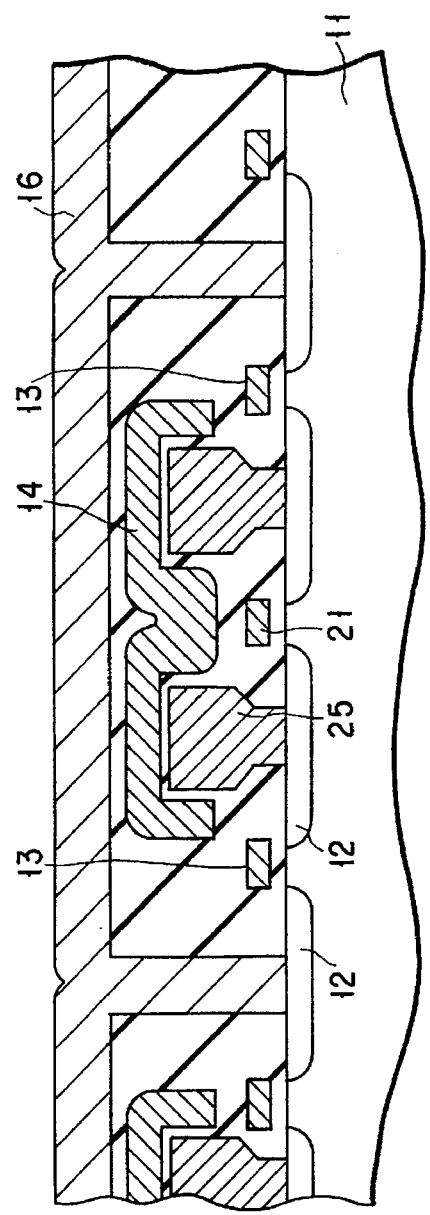
F I G. 13B

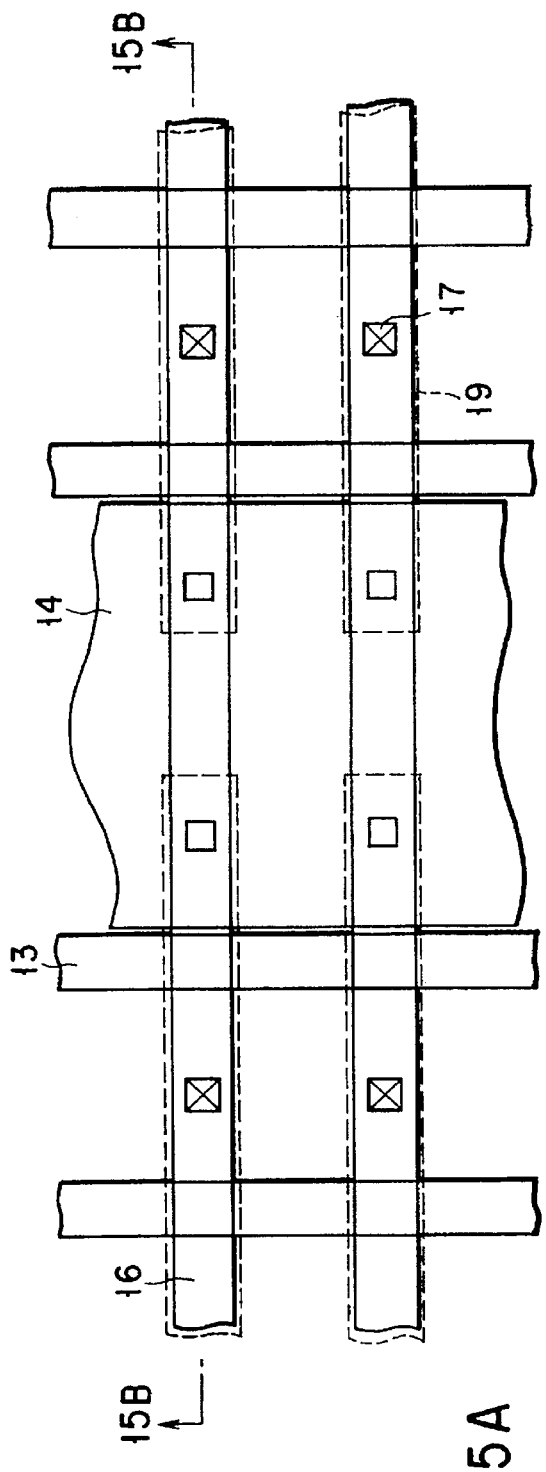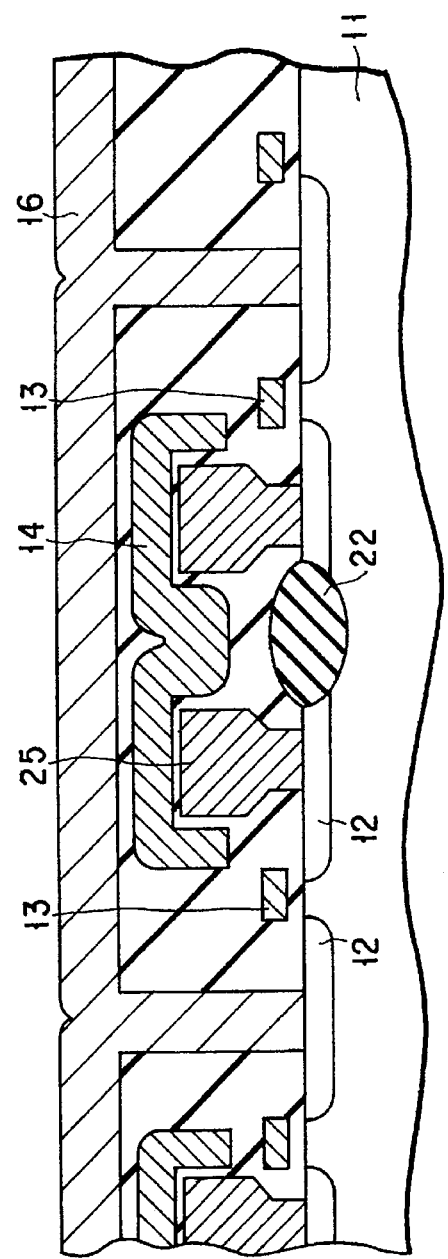
F I G. 15A
F I G. 15B

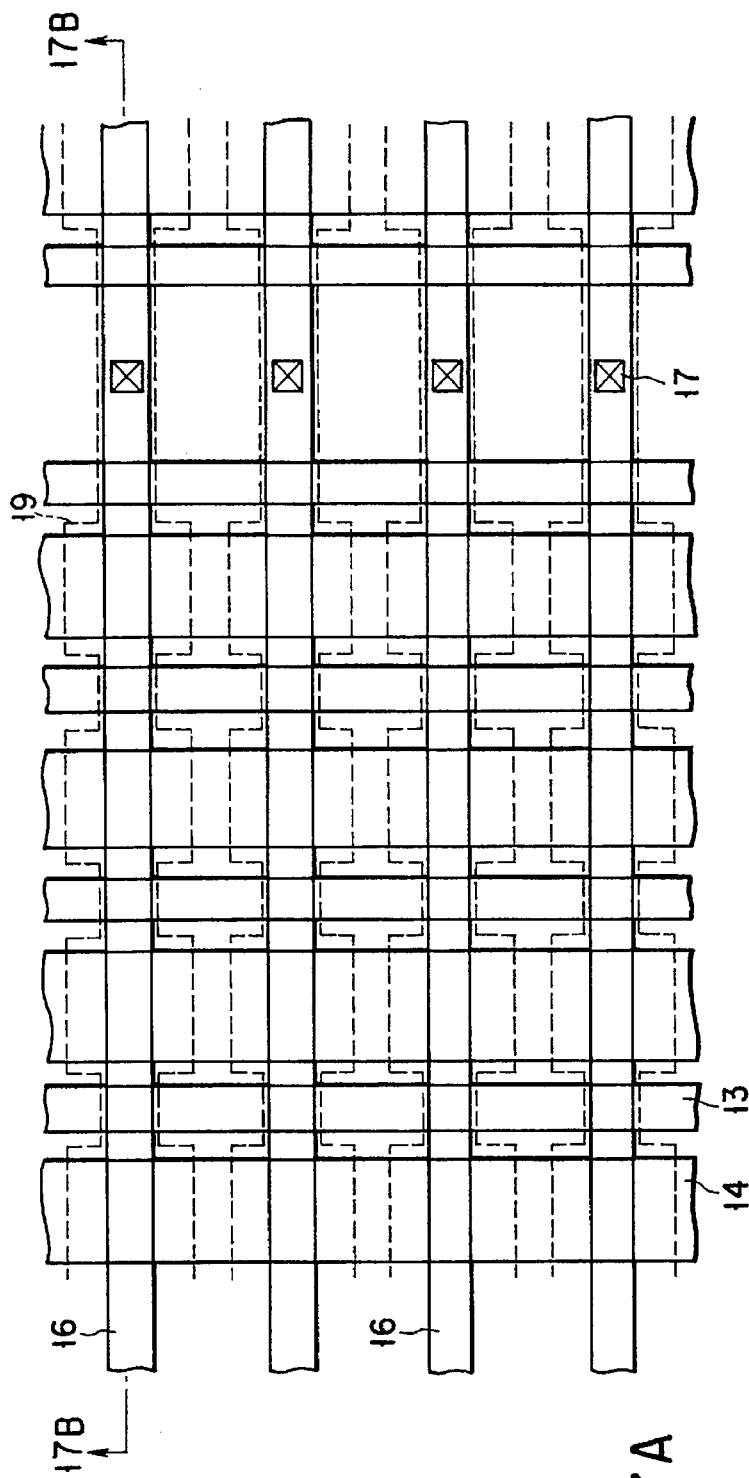
F I G. 17A
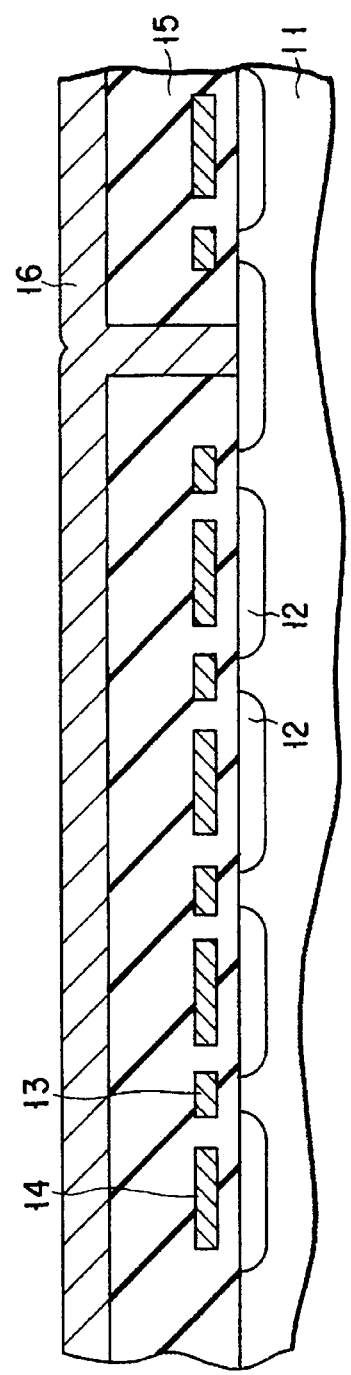
F I G. 17B

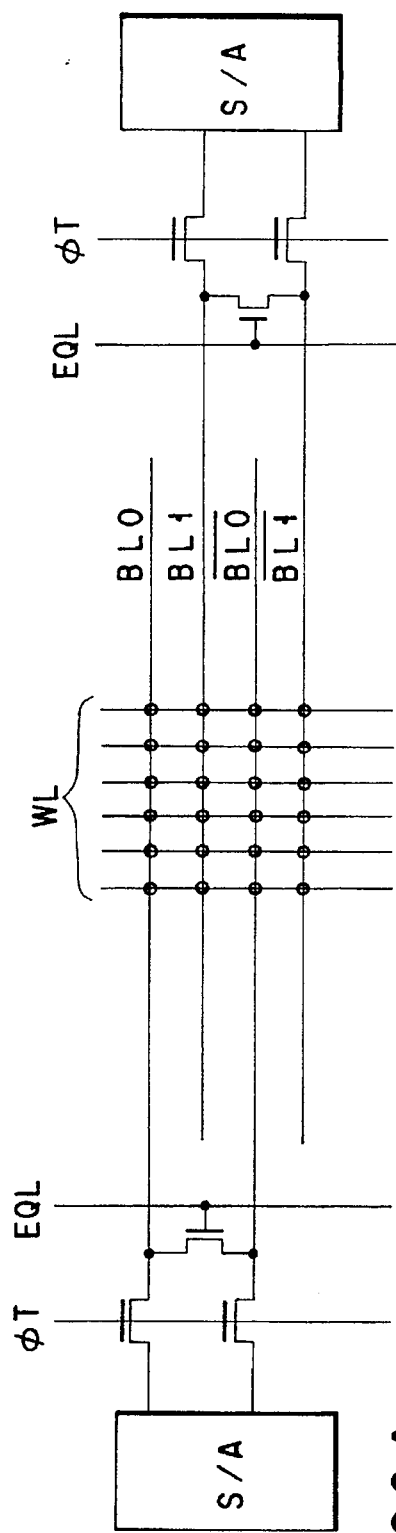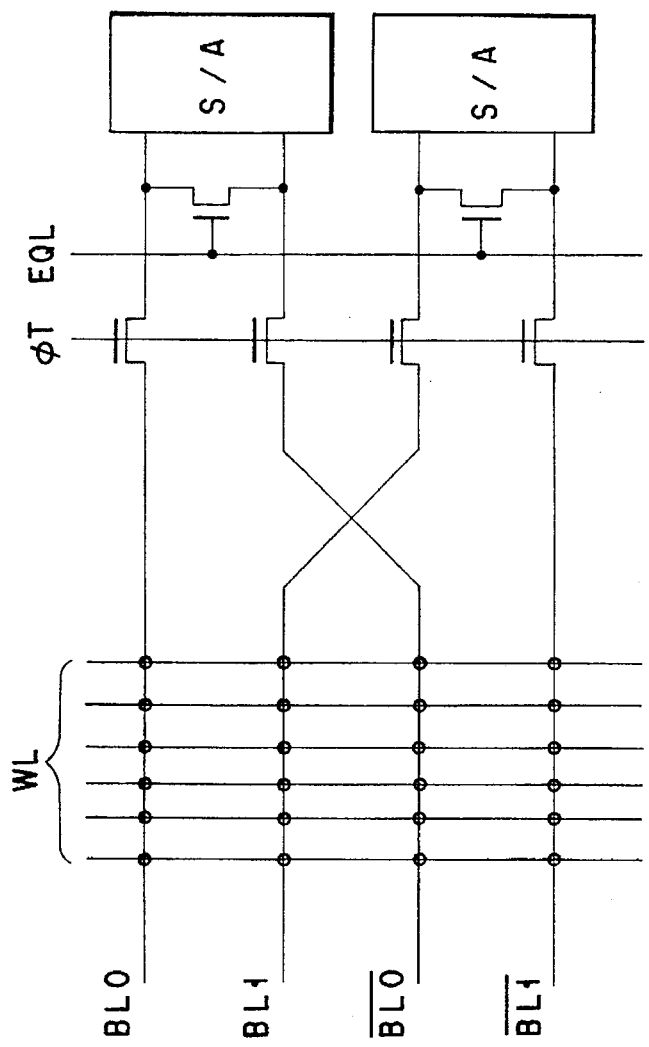
FIG. 20A
FIG. 20B

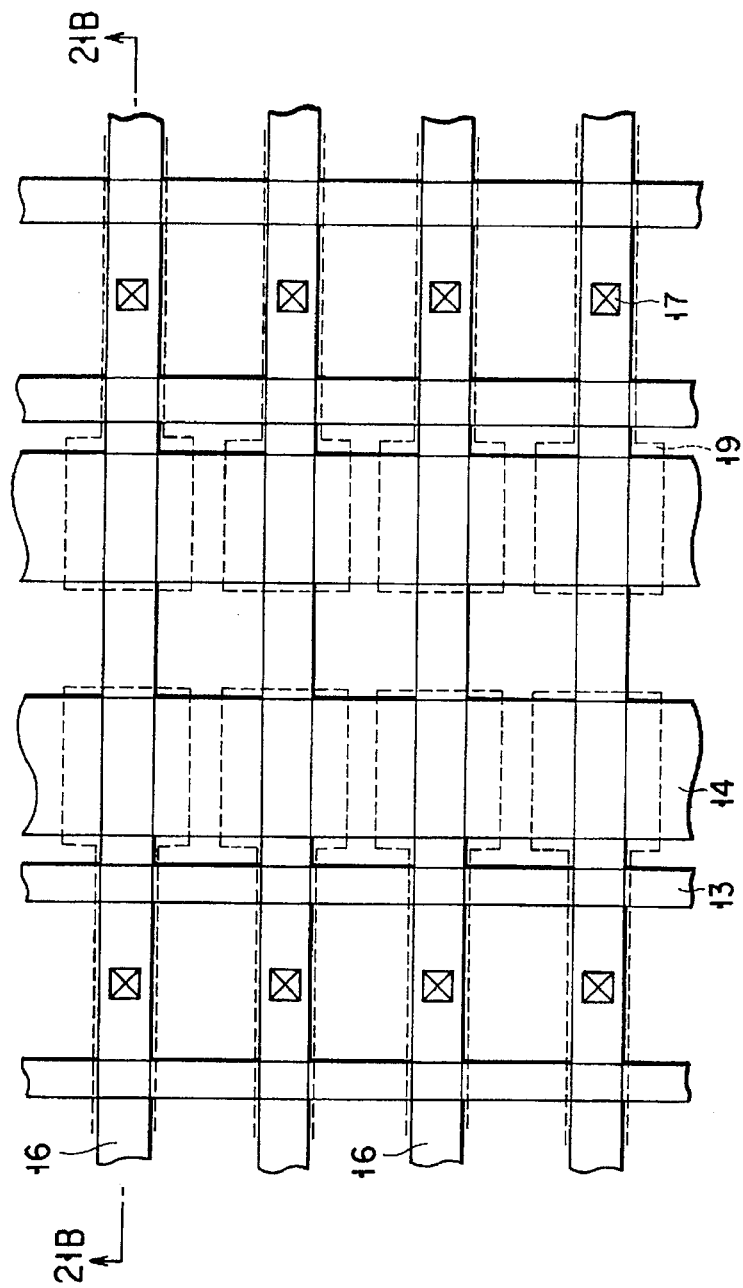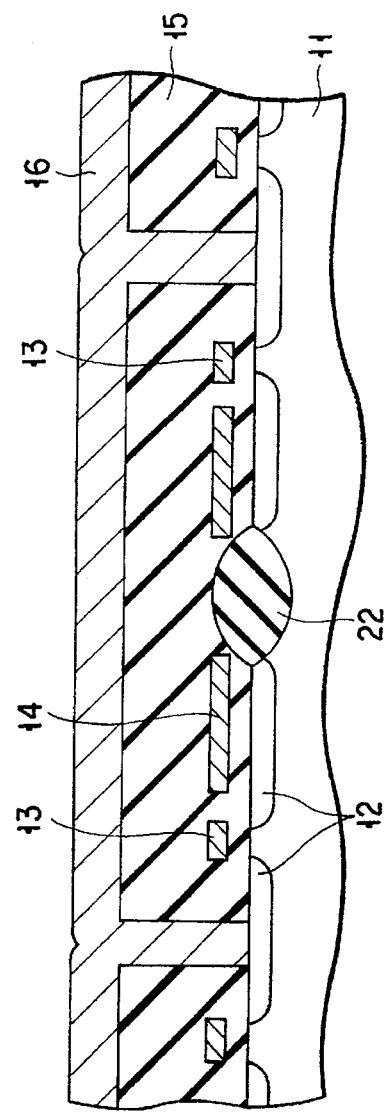
FIG. 21A
FIG. 21B

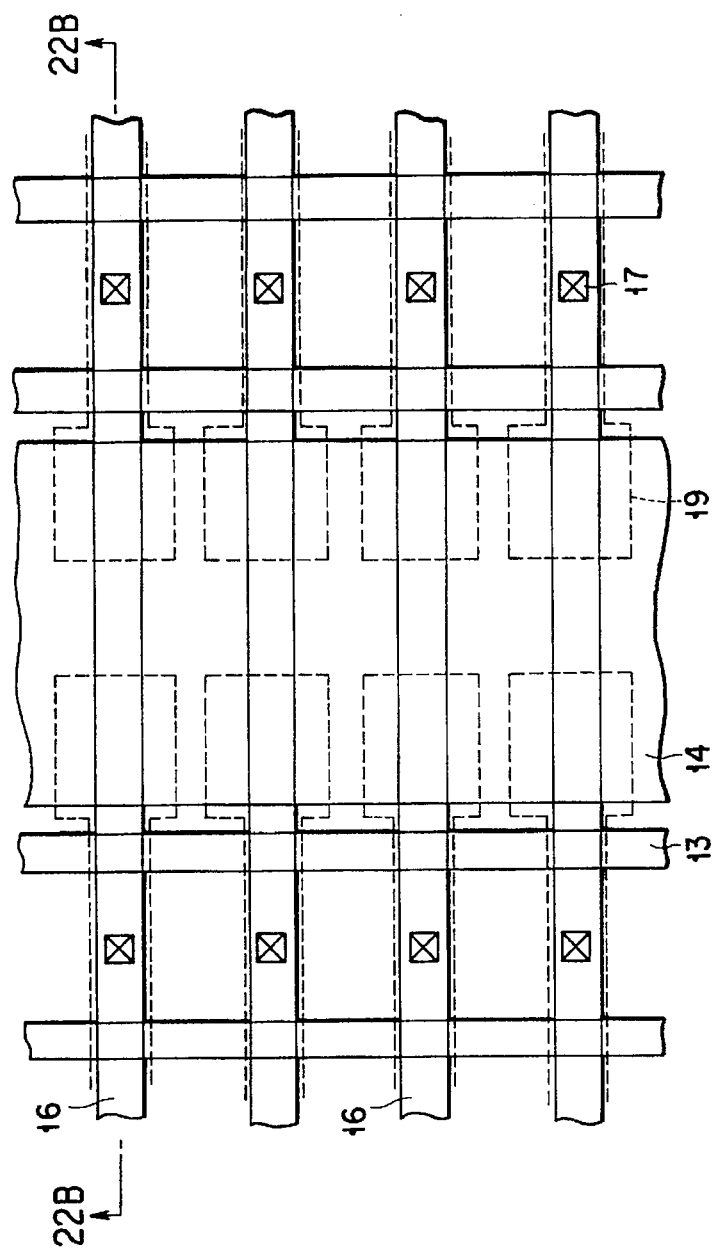
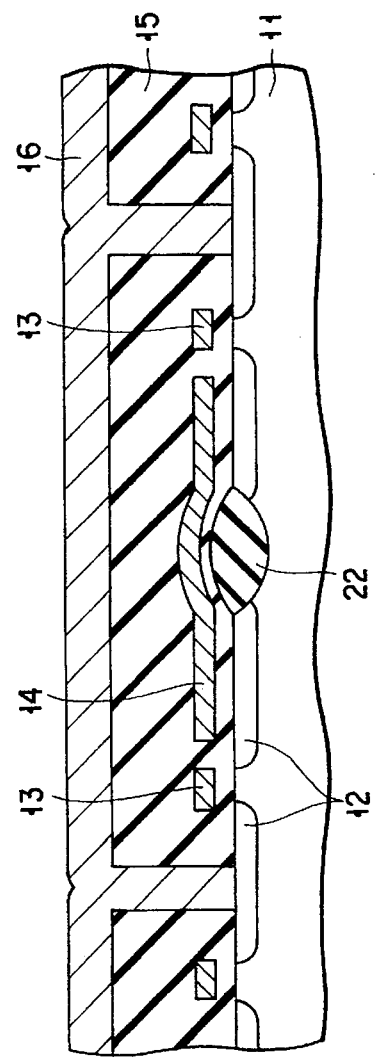
FIG. 22A
FIG. 22B

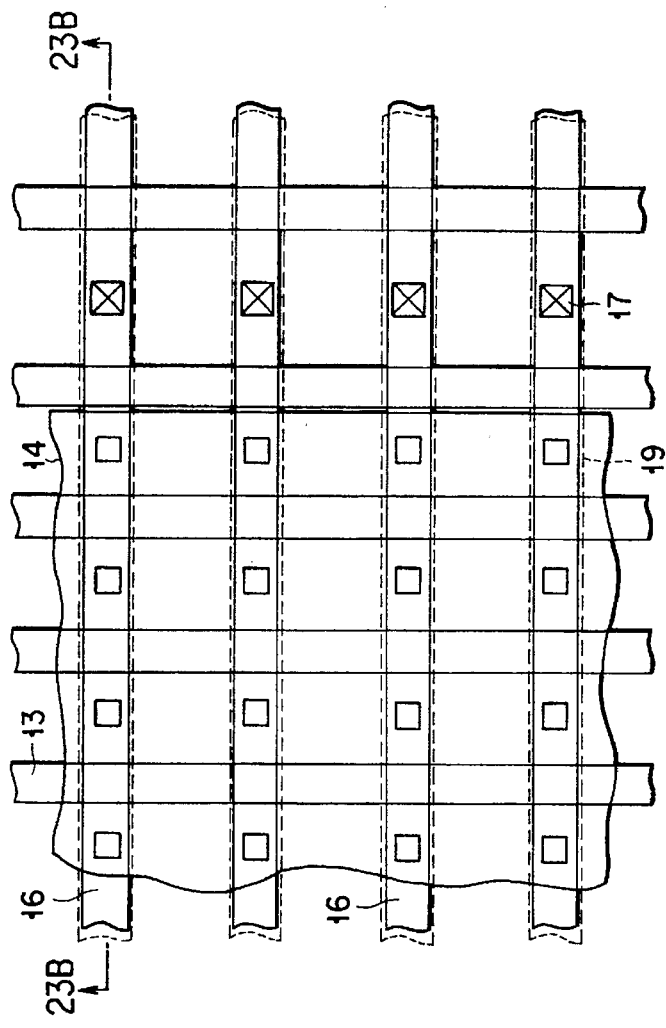
F I G. 23A
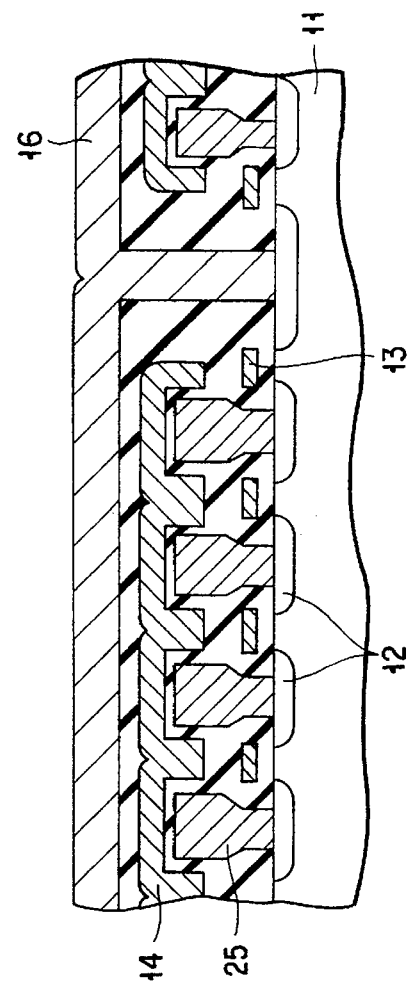
F I G. 23B

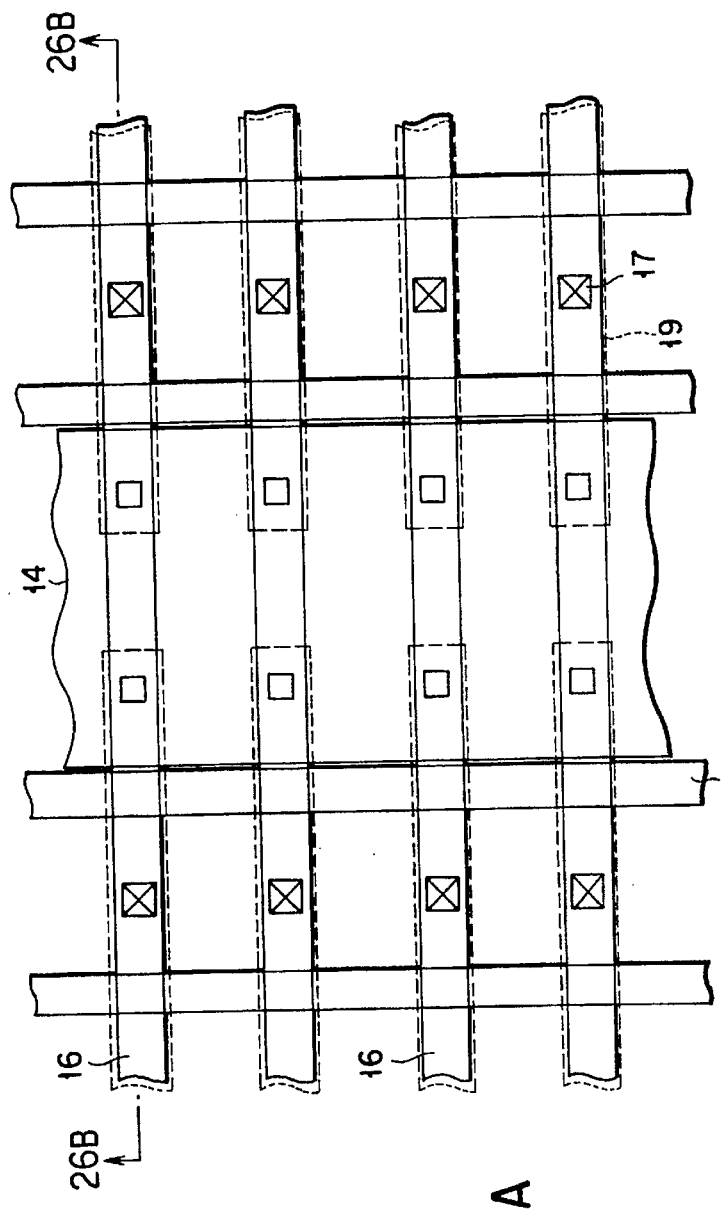
F I G. 26A
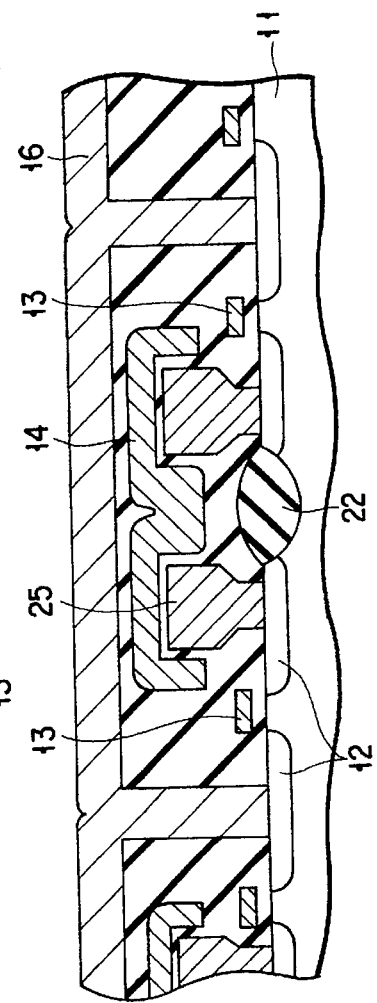
F I G. 26B

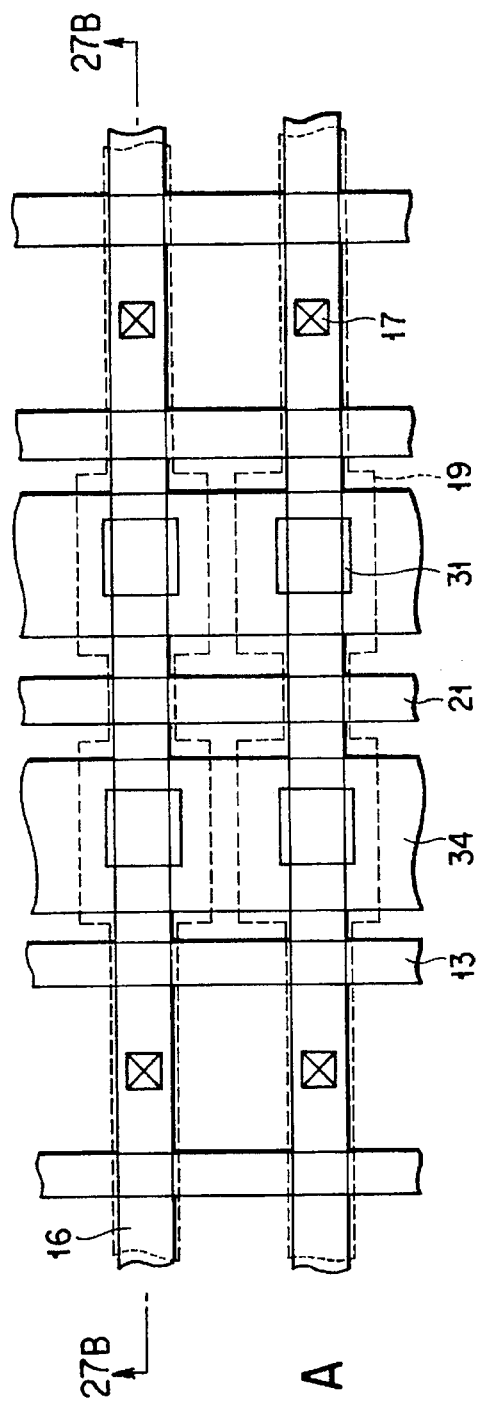
F I G. 27A
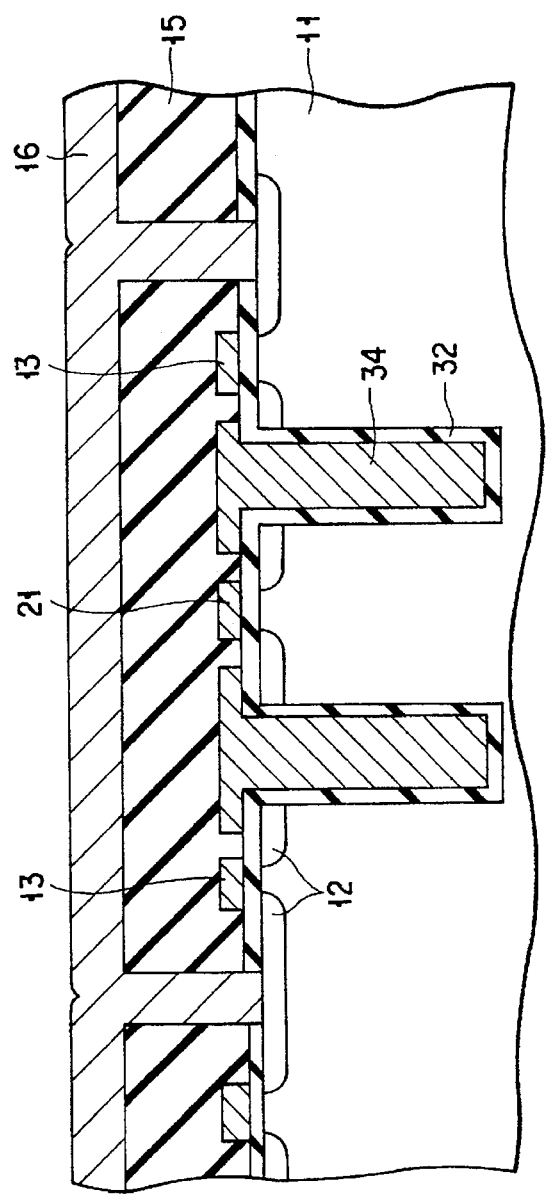
F I G. 27B

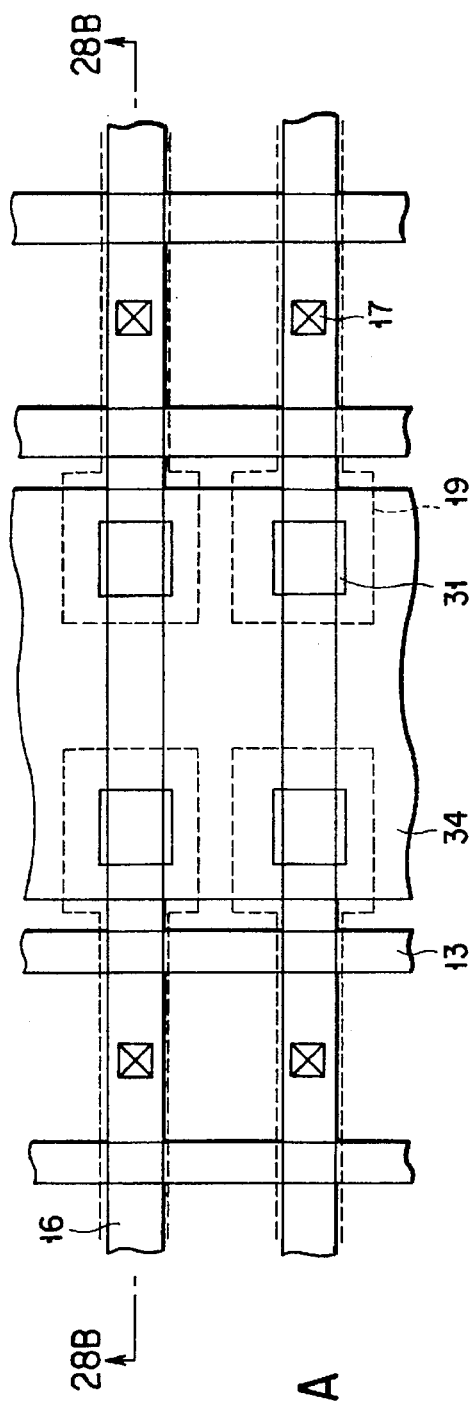
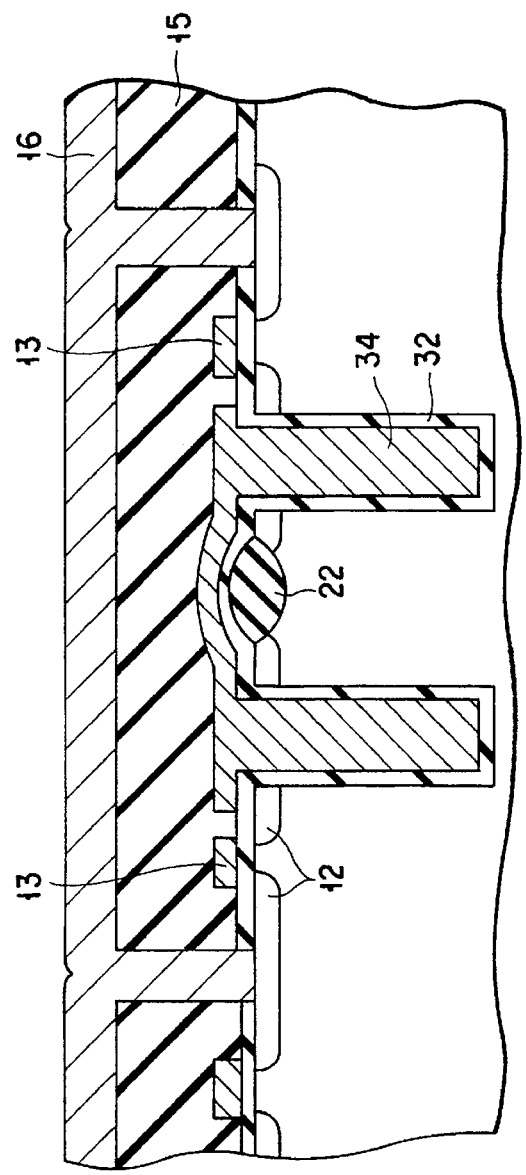
F I G. 28A
F I G. 28B

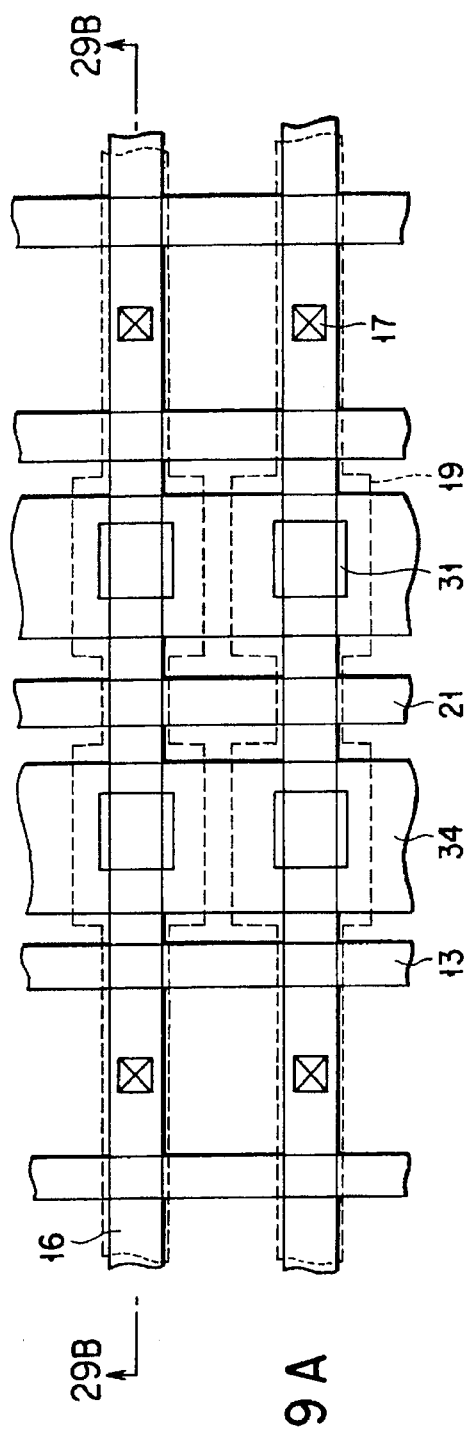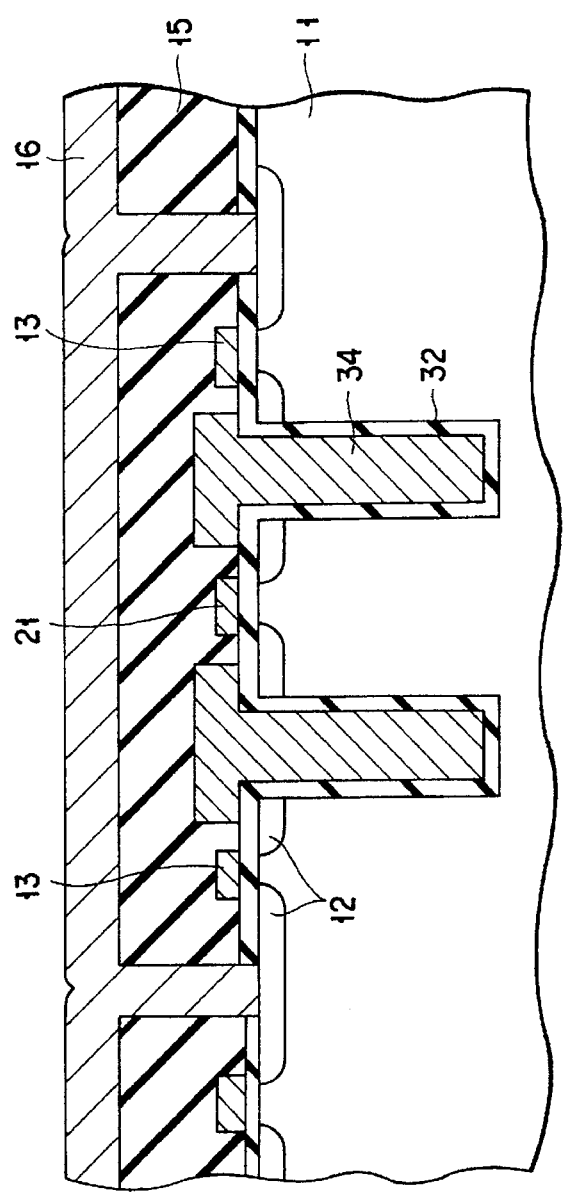
FIG. 29A
FIG. 29B

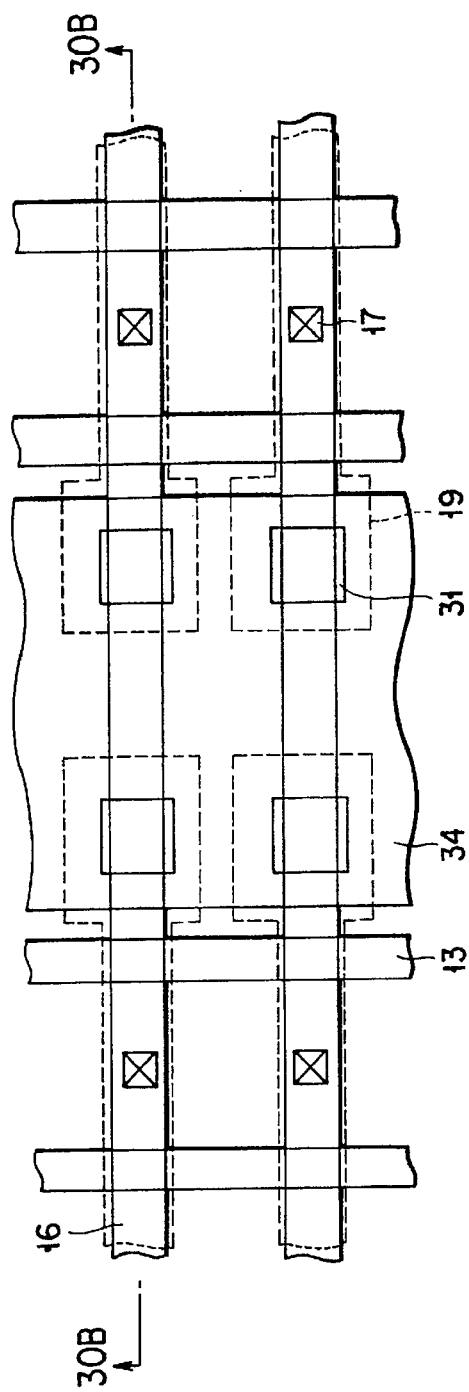
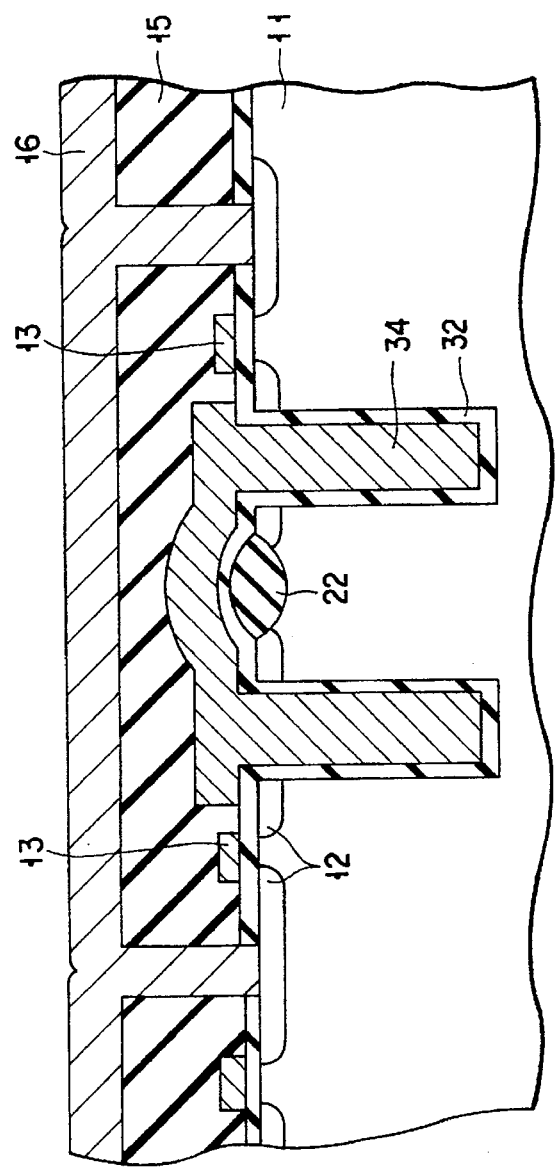
FIG. 30A
FIG. 30B

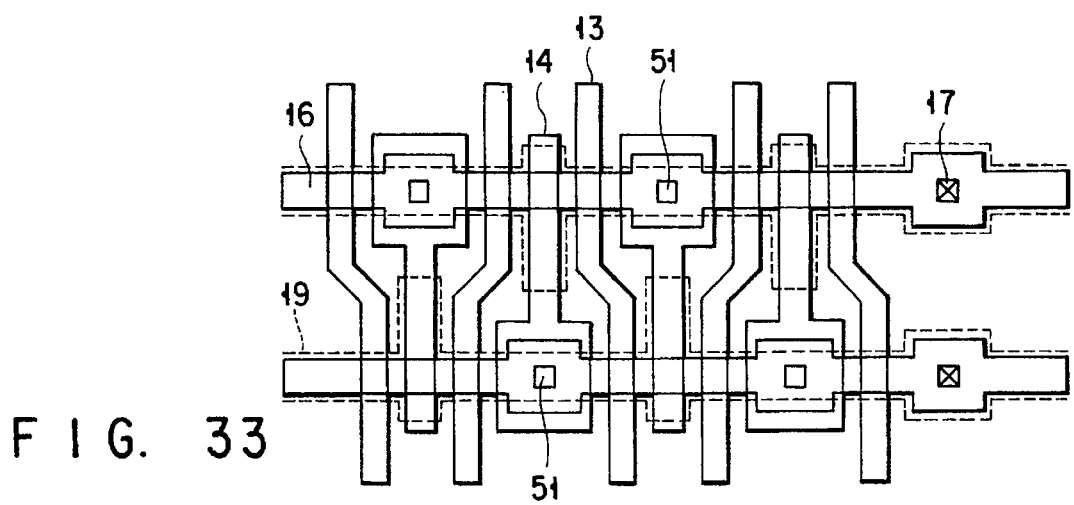
F I G. 33
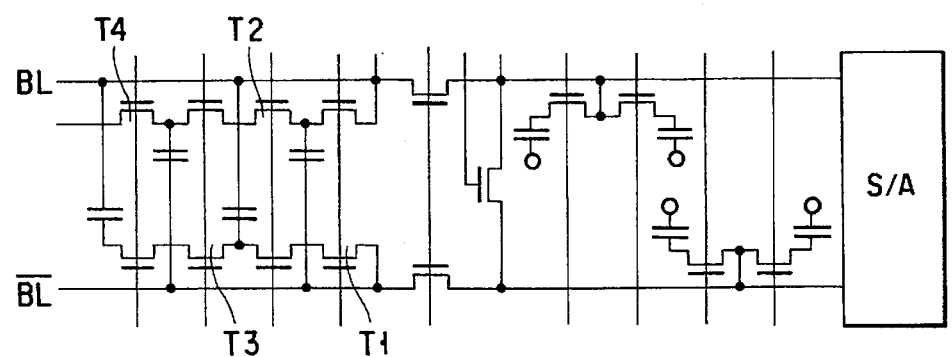
F I G. 34A
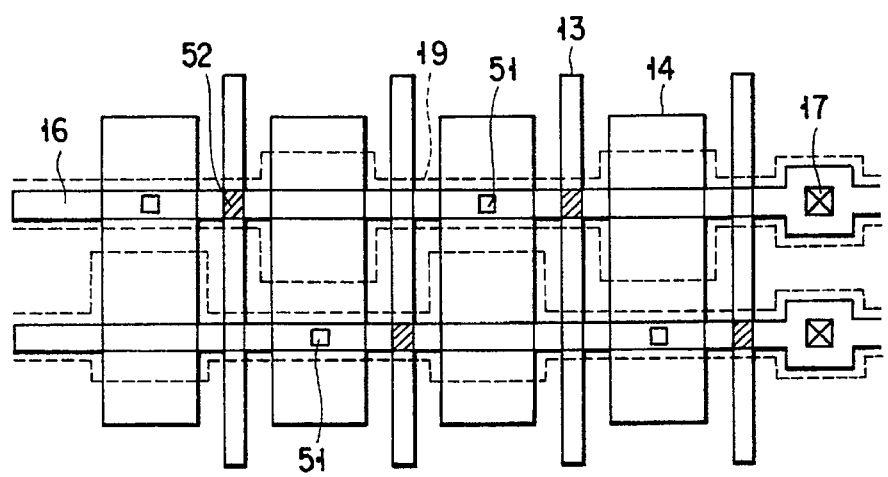
F I G. 34B

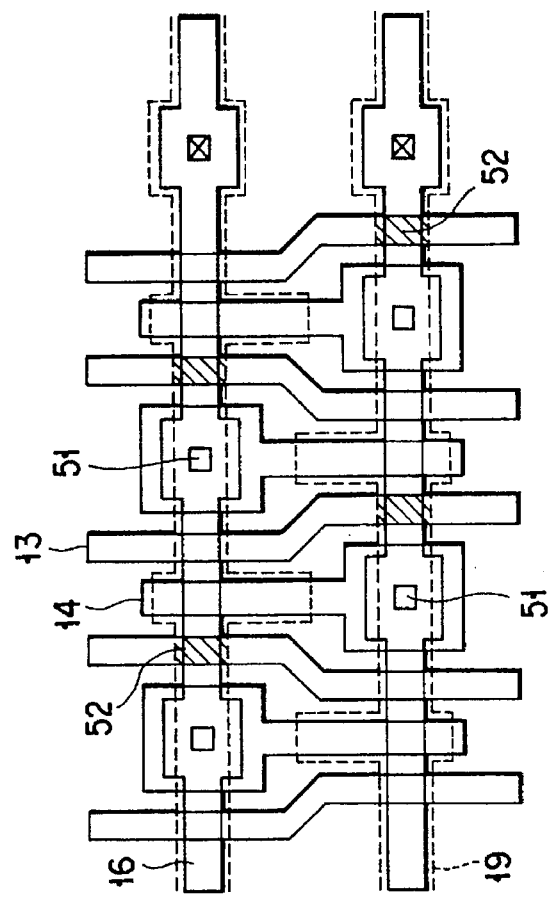
F I G. 35
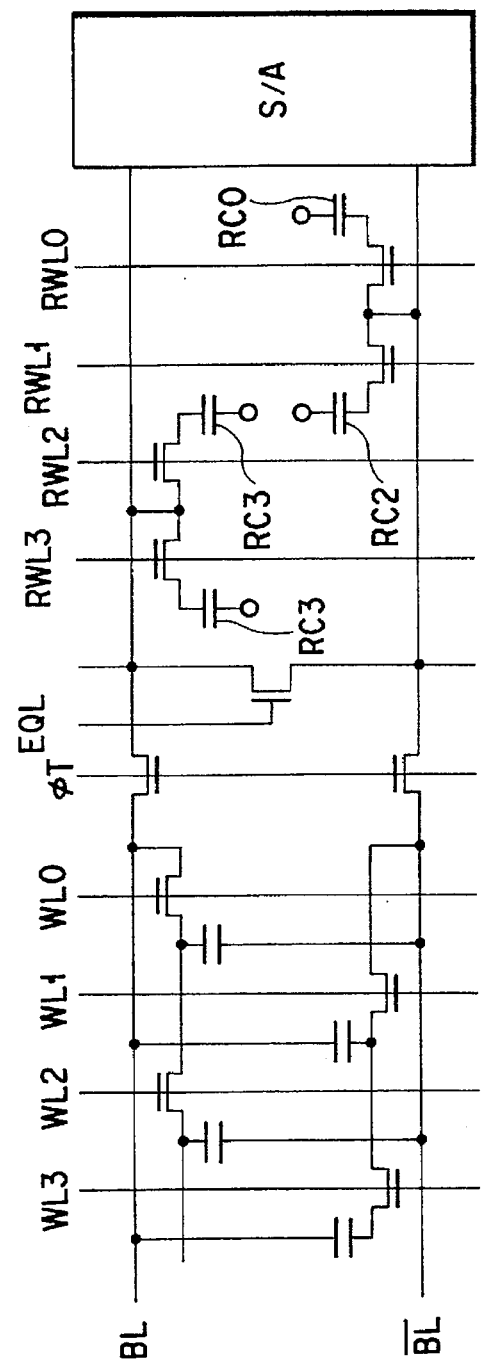
F I G. 36

SEMICONDUCTOR MEMORY DEVICE USING DYNAMIC TYPE MEMORY CELLS

BACKGROUND OF THE INVENTION

1. Field of the Invention

The present invention relates to a semiconductor memory device using dynamic type memory cells and more particularly to a dynamic RAM (DRAM).

2. Description of the Related Art

A DRAM having a one-transistor-one-capacitor memory cell structure is notably progressing in degree of integration in accordance with an improvement in memory cell structure and an advance of fine processing technique. Conventionally, equal to or more than double-layered polysilicon film is employed to form capacitor and transfer gate of a memory cell.

FIG. 1 is a circuit diagram of a conventional general-purpose DRAM, and FIG. 2A is a plan view showing the element structure of the DRAM, while FIG. 2B is a cross-sectional view taken along line 2B–2B of FIG. 2A.

FIGS. 2A and 2B illustrate a semiconductor substrate 1, source and drain diffusion layers 2 of a MOS transistor, word lines 3 each constituted of a polysilicon layer and serving as a gate of the MOS transistor, storage node electrodes 4a each constituted of a polysilicon layer and connected to one of the source and drain diffusion layers and serving as part of a capacitor, plate electrodes 4b each formed of a polysilicon layer and provided on the storage node electrodes with a capacitor insulating film therebetween, an element isolation region 5, and bit lines 6 each connected to the other of the source and drain diffusion layers and formed of wiring metal such as aluminum. As shown in FIG. 2A, the plate electrodes 4b have a plurality of openings 7 through which the bit lines 6 contact the electrodes 4b. In FIG. 2A, the areas surrounded with broken lines are element regions 9.

The above DRAM has a large cell area of $8F^2$, and has a disadvantage that the number of steps of manufacturing is increased since three-layered polysilicon layer is used, and element isolation is performed by LOCOS (Local Oxidation of Silicon).

In addition, in the circuit arrangement shown in FIG. 1, data of a cell selected by a word line connected to a bit line BL is compared with a reference potential of a dummy cell connected to a bit line $\overline{BL}$ in a sense amplifier S/A. When the reference potential is Vcc/2, even if data is either "H" or "L", a difference in potential between bit lines after the data is read out is expressed as follows:

$$(Vcc/2 \cdot Cs)/(CB+Cs)$$

Therefore, since a sufficient cell capacitance Cs cannot be secured due to an increase in bit line capacitance CB and miniaturization of memory cells, the potential difference tends to decrease more and more, and it is thus very important to secure and increase the amplitude of a signal to be read out.

As described above, the conventional DRAM has the following drawbacks. Because of miniaturization of memory cells, the cell capacitance Cs cannot be secured sufficiently, resulting in decrease in noise margin and reliability. Furthermore, the manufacturing steps are increased in number.

SUMMARY OF THE INVENTION

An object of the present invention is to provide a semiconductor memory device capable of securing a large amplitude of signals even if cell capacitance is small, and increasing in noise margin to improve in reliability.

The gist of the present invention lies in that a pair of memory cells is connected to a bit line pair and a single word line and complementary data are written to the memory cells and read out from to the bit lines.

According to a first aspect of the present invention, there is provided a semiconductor memory device comprising: a memory cell array including NAND type memory cell units arranged in matrix, each unit has a plurality of dynamic type memory cells connected in series; a plurality of word lines; a plurality of bit lines arranged within said memory cell array, said plurality of bit lines including a plurality of folded bit line type of bit line pairs, each bit line consisting of one of said bit line pairs being arranged adjacent to each other or arranged such that at least one bit line is interposed therebetween; and a plurality of sense amplifiers of a folded bit line type, provided in each of said plurality of bit line pairs, wherein said memory cells are provided in positions corresponding to intersections of said bit lines and said word lines, and complementary data are written to two memory cells connected to each of said plurality of bit line pairs and one word line, and said two memory cells store one-bit data.

It is desirable for the device that:

(1) the memory cells are plane cells constituted of single polysilicon layer;

(2) the element isolation in the bit line direction is performed by transistor or LOCOS;

(3) the word line is not boosted when data is read out from the memory cells and when data is written thereto; and (4) a plurality of register cells for temporarily storing data of said memory cell is further provided. In this case, the data of said memory cells are amplified and written into said plurality of registers in order from a closet memory cell to a bit line contact in the NAND type memory cell unit, and the data temporarily stored in said plurality of registers are restored in said memory cells, or, a number of said plurality of register cells is the same as that of series-connected said memory cells of said NAND type memory cell unit.

Since complementary cell data are always read out of the bit line pairs by selecting a common word line, the amplitude of one of the cell data is twice as large as that when a reference potential is Vcc/2.

According to a second aspect of the present invention, there is provided a semiconductor memory device comprising: a memory cell array including NAND type memory cell units arranged in matrix, each unit has a plurality of dynamic type memory cells connected in series, said plurality of dynamic type memory cells including transistors and capacitors; a plurality of bit lines arranged within said memory cell array, said plurality of bit lines including a plurality of folded bit line type of a pair of first and second bit lines, each bit line consisting of one of said bit line pairs being arranged adjacent to each other or arranged such that at least one bit line is interposed therebetween; and a plurality of sense amplifiers of a folded bit line type, provided in said bit line pairs, wherein said first bit line is connected to the capacitors and said second bit line is connected to the transistors, data is read out to the first and second bit lines from selected memory cells.

It is desirable for the device that:

(1) the memory cells are plane cells constituted of single polysilicon layer;

(2) the element isolation in the bit line direction is performed by transistor or LOCOS;

(3) the word line is not boosted when data is read out from the memory cells and when data is written thereto;

(4) the contacts between the bit lines and plate electrodes are arranged alternately on each of the bit line pairs; and (5) the switching transistors and normally-on transistors are arranged alternately in the memory cell unit and, if one of two transistors selected by a single word line is a switching transistor, the other transistor is a normally-on transistor.

(6) a plurality of register cells for temporarily storing data of said memory cells is further provided. In this case, the data of said memory cells are amplified and written into said plurality of registers in order from a closet memory cell to a bit line contact in the NAND type memory cell unit, and the data temporarily stored in said plurality of registers are restored in said memory cells, or, a number of said plurality of register cells is the same as that of series-connected said memory cells of said NAND type memory cell unit.

According to the second aspect of the present invention, cell data read out to the bit line pairs BL and $\overline{BL}$ are always complementary to each other, and the amplitude of signals is four times as large as that when a reference potential is Vcc/2. Even though the cell capacitance is reduced, a remarkably large noise margin can be secured and the reliability can be improved. Since, moreover, the word lines need not be boosted, a DRAM free of a boosting circuit can be achieved.

When adjacent two bit lines are paired with each other, anti-phase noise is always caused on the plate and a variation in plate potential due to charging/discharging of the bit lines is offset, with the result that a variation in cell data due to plate noise can be prevented. In this case, one bit line can be provided between the bit line pairs.

It is evident from the above that a memory with high reliability can be attained by a simpler manufacturing process of the present invention.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 2A and 2B are views of the element structure of the conventional DRAM shown in FIG. 1;

FIG. 3 is a circuit diagram of a DRAM according to a first (fourth) embodiment of the present invention;

FIGS. 4A and 4B are views of the element structure of the DRAM shown in FIG. 3;

FIG. 5 is a plan view showing a conventional cell layout;

FIG. 6 is a plan view showing a cell layout of the present invention;

FIG. 7 is a circuit diagram of a DRAM according to a second (fifth, thirteenth, fifteenth) embodiment of the present invention;

FIG. 9 is a circuit diagram of a DRAM according to a third (sixth, fourteenth, sixteenth) embodiment;

FIGS. 10A and 10B are views of the element structure of the DRAM shown in FIG. 9;

FIGS. 13A and 13B are views of the element structure of a DRAM according to the fifth embodiment;

FIGS. 15A and 15B are views of the element structure of a modification to the DRAM shown in FIGS. 14A and 14B;

FIGS. 17A and 17B are views of the element structure of the DRAM shown in FIGS. 16A and 16B;

FIGS. 20A and 20B are circuit diagrams of a DRAM according to the ninth and twelfth embodiments of the present invention;

FIGS. 21A and 21B are views of the element structure of the DRAM shown in FIGS. 20A and 20B;

FIGS. 22A and 22B are views of the element structure of a modification to the DRAM shown in FIGS. 20A and 20B;

FIGS. 23A and 23B are views of the element structure of a DRAM according to a tenth embodiment of the present invention;

FIGS. 26A and 26B are views of the element structure of a modification to the DRAM shown in FIGS. 25A and 25B;

FIGS. 27A and 27B are views of the element structure of a DRAM according to a thirteenth embodiment of the present invention;

FIGS. 28A and 28B are views of the element structure of a DRAM according to a fourteenth embodiment of the present invention;

FIGS. 29A and 29B are views of the element structure of a DRAM according to a fifteenth embodiment of the present invention;

FIGS. 30A and 30B are views of the element structure of a DRAM according to a sixteenth embodiment of the present invention;

FIG. 33 is a view showing another example of the element structure of the DRAM shown in FIGS. 32A and 32B; FIGS. 34A and 34B are views of the circuit arrangement and the element structure of a DRAM according to a nineteenth embodiment of the present invention; FIG. 35 is a view showing another example of the element structure of the DRAM shown in FIGS. 34A and 34B; and FIG. 36 is a circuit diagram of a DRAM according to a twentieth embodiment of the present invention.

DETAILED DESCRIPTION OF THE PREFERRED EMBODIMENTS

Figure 1:
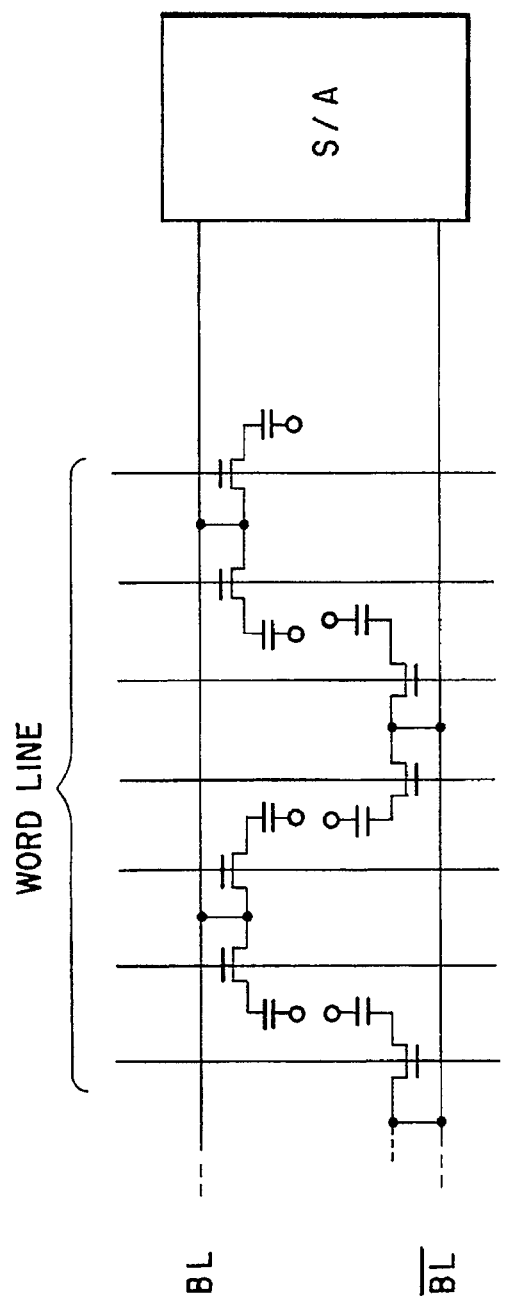
FIG. 1 is a circuit diagram of a conventional DRAM.

Embodiments of the present invention will now be described in detail with reference to the accompanying drawings.

FIRST EMBODIMENT

FIGS. 3, 4A and 4B are views for explaining a DRAM according to a first embodiment of the present invention. Of these figures, FIG. 3 is a circuit diagram of the DRAM, FIG. 4A is a plan view of the element structure of the DRAM, and FIG. 4B is a cross-sectional view taken along line 4B—4B of FIG. 4A.

The first embodiment is directed to a NAND type DRAM including a plurality of memory cells connected in series, and these memory cells are plane cells each of which a gate of the transistor and a plate electrode of the capacitor are constituted of single-layered polysilicon layer as a single-layer conductive layer. In this embodiment, the number of the series-connected memory cells is four but can be changed when necessary.

The DRAM of the first embodiment is of a folded bit line type in which a pair of adjacent bit lines BL and $\overline{BL}$ is connected to a sense amplifier S/A, as illustrated in FIG. 3. A NAND type memory cell unit (NAND cell) having four dynamic type memory cells C0 to C3 connected in series is connected to the bit line BL, and a NAND cell having four dynamic memory cells C0' to C3' connected in series is connected to the bit line $\overline{BL}$. Word lines WL to WL3 are used in common for both the NAND cells.

Data is read out of the sense amplifier S/A and temporarily stored in four register cells RC0 to RC3. The number of the register cells corresponds to that of the series-connected memory cells of each of the NAND cells.

FIG. 3 shows only one bit line pair. It is however needless to say that a large number of bit line pairs are arranged and a sense amplifier S/A is connected to each of the bit line pairs. It is also needless to say that a large number of NAND cells are connected to one bit line.

FIGS. 4A and 4B show a semiconductor substrate 11, source and drain diffusion layers 12 of a MOS transistor, word lines 13 each constituted of first polysilicon layer and serving as a gate of the MOS transistor, plate electrodes 14 each constituted of the first polysilicon layer and serving as part of a capacitor, an interlayer insulative film 15, bit lines 16, and bit line contacts 17. In FIG. 4A, the areas surrounded with broken lines are element regions 19. One of the source and drain regions functions as a storage node electrode.

The DRAM with the above structure has the advantages that the manufacturing steps can be decreased in number since the word lines 13 and plate electrodes 14 are formed of the same material (single-layered polysilicon layer), and the plate electrodes are easy to process since they are simply striped and parallel to one another. Moreover, a high dielectric film such as BST as well as a silicon oxide film can be used for a capacitor insulative film in order to increase in capacitance itself.

An operation of the DRAM of the first embodiment will be described in brief.

The word lines WL0, WL1, WL2 and WL3 rise in this order, starting with word line WL0 connected to the memory cells C0 and C0' nearest to the bit line contact, and cell data read out from the bit line pairs BL and $\overline{BL}$ are amplified by the sense amplifier S/A and written to the register cell RC0. The cell data are always complementary to each other, saying that if one is Vcc, the other is Vss. When four cell data of each of the bit lines are held in the register cells RC0 to RC3, the data of the register cells are stored again in the memory cells, starting with memory cells C3 and C3' farthest from the bit line contact, and the word lines WL3, WL2, WL1 and WL0 fall in this order.

When cell data is "L" and the bit line precharge potential is Vcc/2, the potential of each of the bit lines BL and $\overline{BL}$ is:

$$(Vcc/2 \cdot CB + Vcc \cdot Cs)/(CB+Cs).$$

When cell data "n" is read out, the potential is:

$$(Vcc/2 \cdot CB + 0 \cdot Cs)/(CB+Cs).$$

Since the cell data read out from the bit lines BL and $\overline{BL}$ are always complementary to each other, the potential difference (signal amplitude) between them is expressed as follows:

$$VBL(H) - VBL(L) = Vcc \cdot Cs/(CB+Cs)$$

According to the first embodiment described above, since the cell data, which are read out of the bit line pairs BL and $\overline{BL}$ by selecting their common word line, are always complementary to each other, the amplitude of one of the cell data is twice as large as that when a reference potential is Vcc/2. The twofold increase in signal amplitude results in the following advantages.

First, the cell capacitance Cs can be made smaller than the conventional one. Secondly, since the word lines need not be boosted, a booster circuit is not required, and a manufacturing process can be simplified. In this case, a gate insulative film Tox can be thinned and a gate length L can be shortened accordingly. The memory cells can thus be decreased in size further.

In the NAND type DRAM having the above-described single-layered polysilicon structure, as shown in FIG. 4A, the plate electrodes are arranged in parallel to one another, and each of them is interposed between the word lines to read out data from all the bit lines adjacent thereto. The potential variations of the plate electrodes can thus be controlled. Conventionally, if the reference potential is Vcc/2 in FIG. 3, data of cells C0 and C0' are read out from the bit lines BL and $\overline{BL}$ when the word line WL0 rises. If the bit lines BL and $\overline{BL}$ are amplified and the potential Vcc/2 is changed to Vcc or 0, the plate potential varies with charging/discharging of the bit lines since these bit lines are formed over the common plate electrode.

In the first embodiment, however, since the readout cell data are complementary to each other, the bit lines BL and $\overline{BL}$ are always reversely amplified. Therefore, the variation in plate potential is offset and the cell data is not changed, with the result that an operation can be performed with higher reliability.

According to the structure of the DRAM of the first embodiment, the required number of memory cells is twice as many as that in the conventional case. However, in view of the twofold increase in signal amplitude and no variations in dummy cell, the size of a cell of the present invention can be reduced to about 80% of that of a single-layer plane cell of a folded DRAM, if the same signal amplitude is obtained from the cells of the prior art and the present invention. FIGS. 5 and 6 are views of the layout of memory cells having the same capacitor area for storing one-bit data (the same signal amplitude). FIG. 5 shows the layout of four cells (for 4 bits) in the conventional case, while FIG. 6 does that of eight cells (for 4 bits) in the first embodiment. The minimum processing measure is 1 μm. While the layout area of the prior art is 231 μm$^2$, that of the present invention is 202.5 μm$^2$. Therefore, the layout area of the present invention can be decreased to about 87.7% of that of the prior art.

In the comparison between FIGS. 5 and 6, the memory cells of the present invention are simply twice as many as the same memory cells of the prior art. If, as described above, the memory cells are decreased in size by using no booster circuits, thinning a gate insulation film and shortening a gate length, the area of the memory cells per bit is reduced.

SECOND EMBODIMENT

Figure 8A:
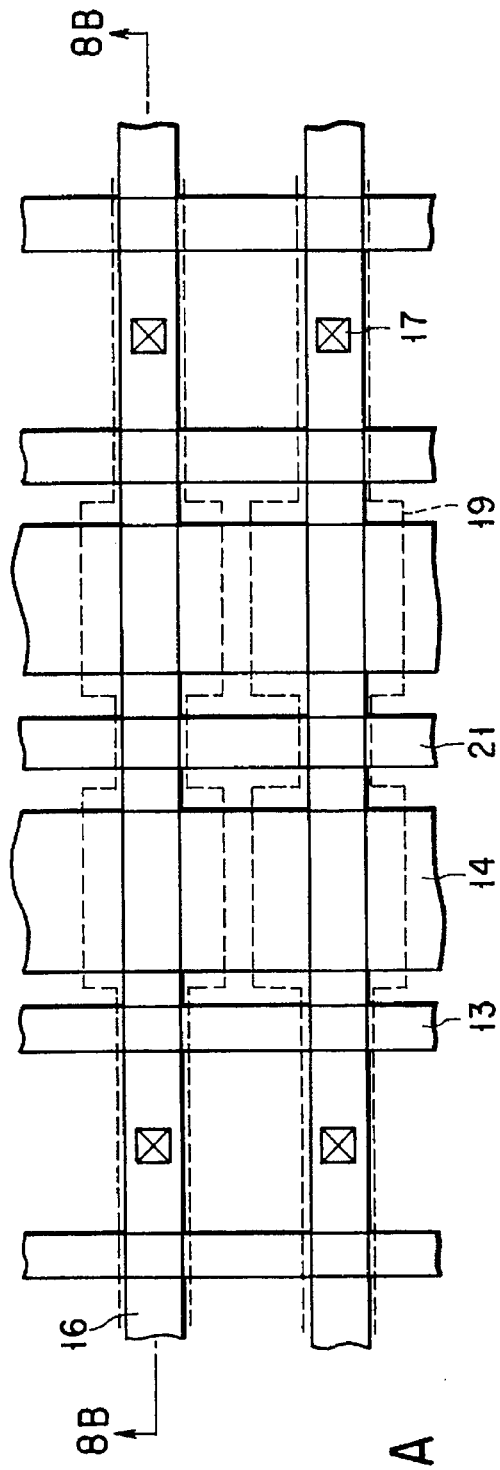
FIGS. 8A and 8B are views of the element structure of the DRAM shown in FIG. 7.
Figure 8B:
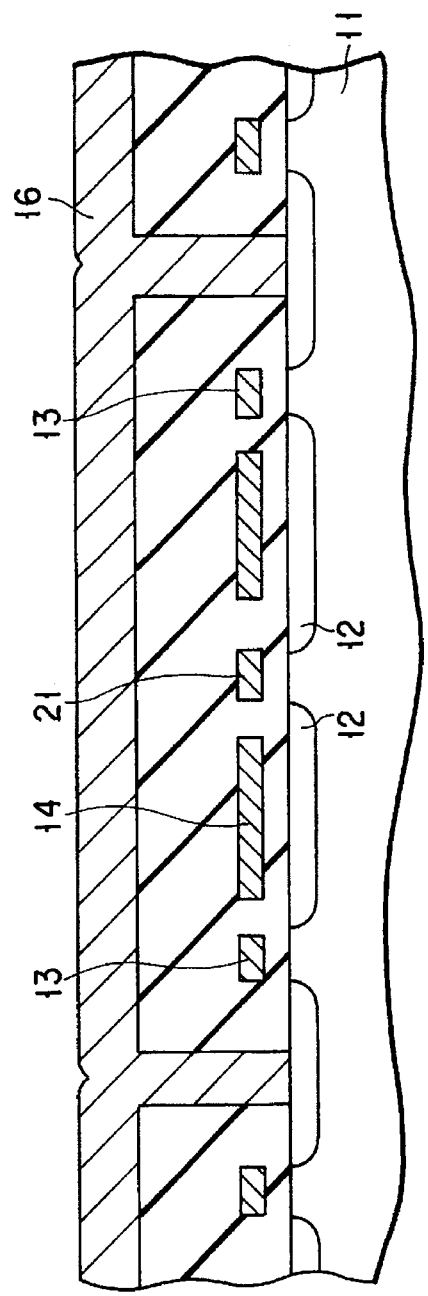

FIGS. 7, 8A and 8B are views for explaining a DRAM according to a second embodiment of the present invention. Of these figures, FIG. 7 is a circuit diagram of the DRAM, FIG. 8A is a plan view of the element structure of the DRAM, and FIG. 8B is a cross-sectional view taken along line 8B—8B of FIG. 8A. In the second embodiment, the same structural elements as those of the first embodiment are denoted by the same reference numerals.

The second embodiment is directed to a NAND type DRAM using one of the memory cells of the first embodiment, that is, a general-purpose memory cell. As in the first embodiment, the memory cell is a folded bit line type plane cell formed of single-layered polysilicon layer. In the second embodiment, element isolation is performed by a transistor 21 whose gate is set to Vss. The reason is as follows. The original pattern can be used as it is and thus the number of manufacturing steps need not be increased. A large space for the element isolation is not required.

Since the memory cell of the second embodiment is constituted of single-layered polysilicon layer, a word line 13 and a plate 14 are arranged parallel to each other as shown in FIG. 8A. The memory cell is simple in shape and easy to process.

Complementary data are written to cells C0 and C0', and an operation of reading the data out of the cells is the same as that in the first embodiment. The signal amplitude is also twice as large as that in the case of the conventional reference potential.

The advantages of the first embodiment are all applicable to the second embodiment. The twofold increase in signal amplitude diminishes cell capacitance Cs, makes a word line booster circuit unnecessary, and reduces the number of manufacturing steps.

Since complementary data are always read from adjacent bit lines to a selected word line, noise caused on the plate is offset. It is thus possible to prevent cell data from being destroyed owing to variations in plate potential, and to enlarge a noise margin.

In the second embodiment, too, the required number of memory cells is twice as many as that in the conventional case. Since the area of one-NAND cell using single-layered polysilicon layer is 10 F$^2$, that of the memory cell of the second embodiment is 20F$^2$. However, the size of the memory cell is about 9/10 as small as that of a general-purpose cell formed of single-layered polysilicon layer and having an area of 12F$^2$.

THIRD EMBODIMENT

FIGS. 9, 10A and 10B are views for explaining a DRAM according to a third embodiment of the present invention. Of these figures, FIG. 9 is a circuit diagram of the DRAM, FIG. 10A is a plan view of the element structure of the DRAM, and FIG. 10B is a cross-sectional view taken along line 10B—10B of FIG. 10A. In the third embodiment, the same structural elements as those of the first embodiment are denoted by the same reference numerals.

In the third embodiment, the element isolation of the second embodiment is performed by an element isolation insulative film 22 using a method other than the transistor, e.g., LOCOS. In this embodiment, too, a folded bit line type plane cell formed of single-layered polysilicon layer is employed, and data read out of the bit lines BL and $\overline{BL}$ after one word line rises, are complementary to each other. Since the memory cell of the third embodiment is constituted of single-layered polysilicon layer, word lines 13 and plate electrodes 14 are parallel to each other as shown in FIG. 10A. The memory cell is thus simple in shape and easy to process.

Figure 11A:
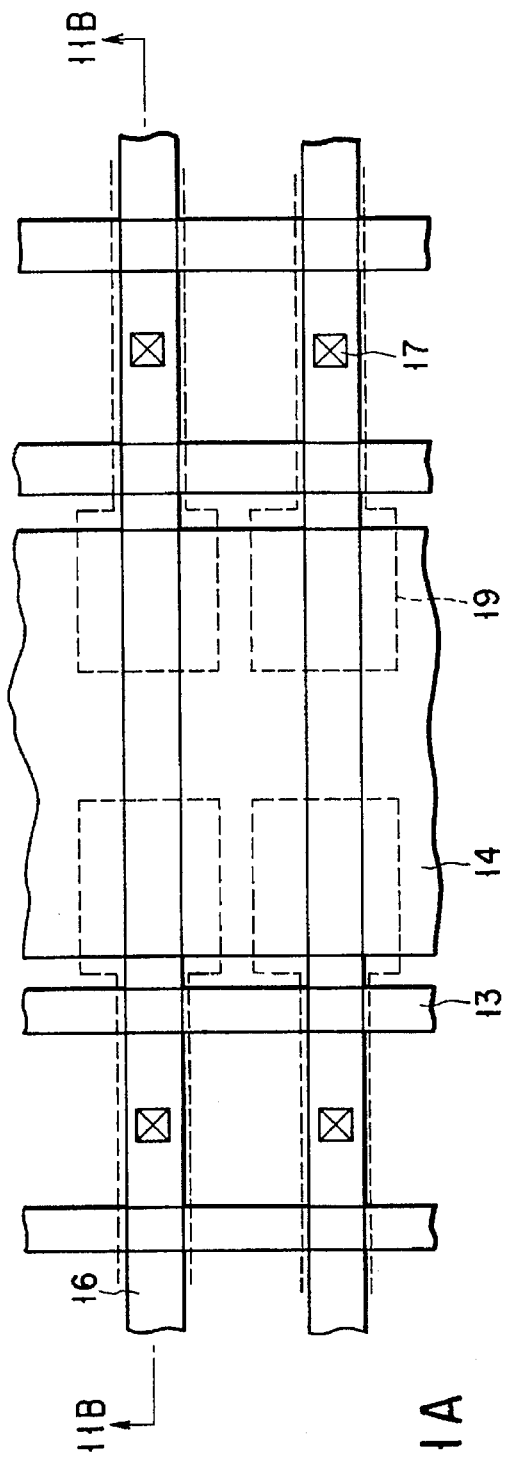
FIGS. 11A and 11B are views of the element structure of a modification to the DRAM shown in FIG. 9.
Figure 11B:
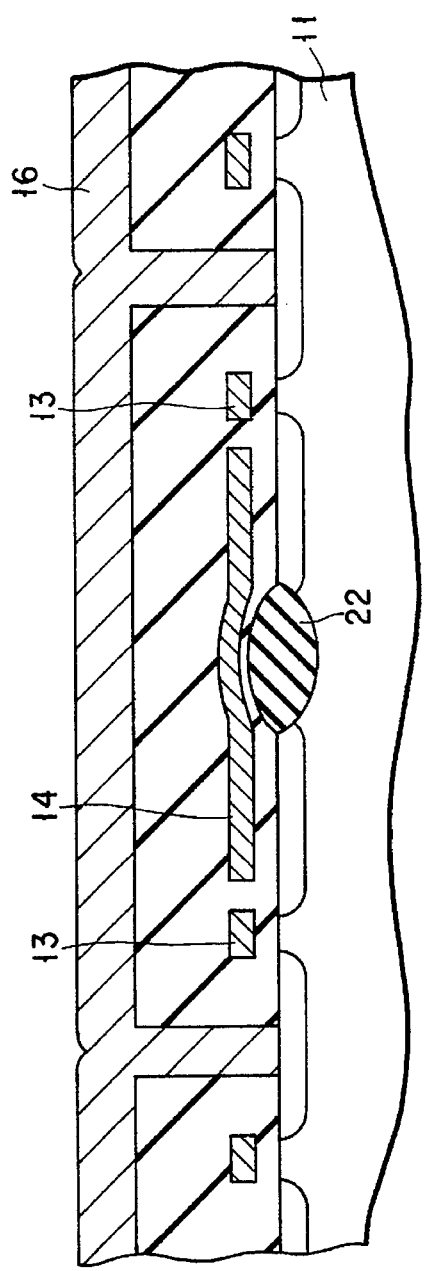

The advantages of the first embodiment are all applicable to the third embodiment. As illustrated in FIGS. 11A and 11B, in place of separated plate electrodes 14, a single plate electrode 14 can be formed over the element isolation insulative film 22. FIG. 11B is a cross-sectional view taken along line 11B—11B of FIG. 11A.

FOURTH EMBODIMENT

Figure 12A:
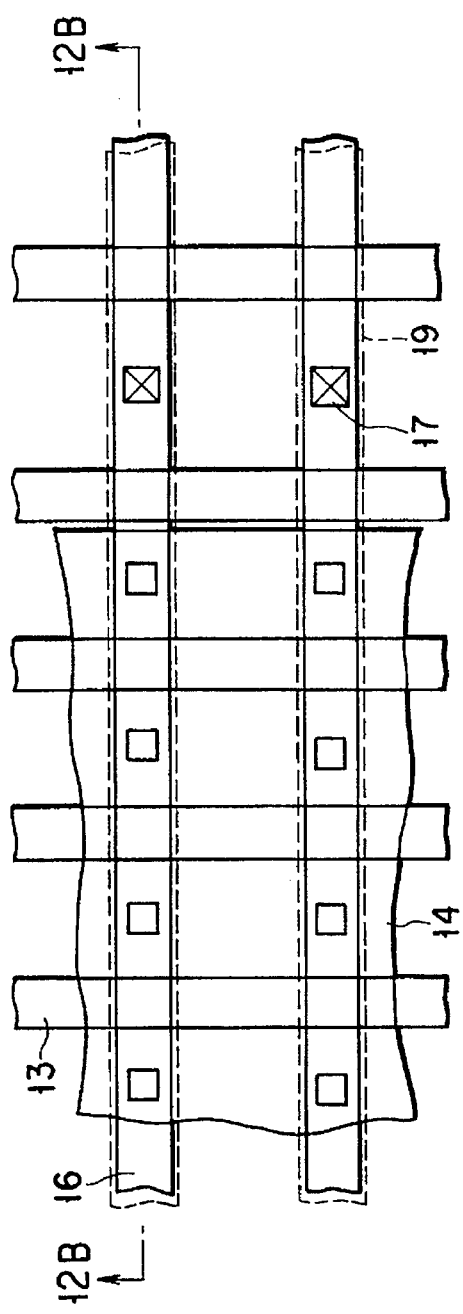
FIGS. 12A and 12B are views of the element structure of a DRAM according to the fourth embodiment.
Figure 12B:
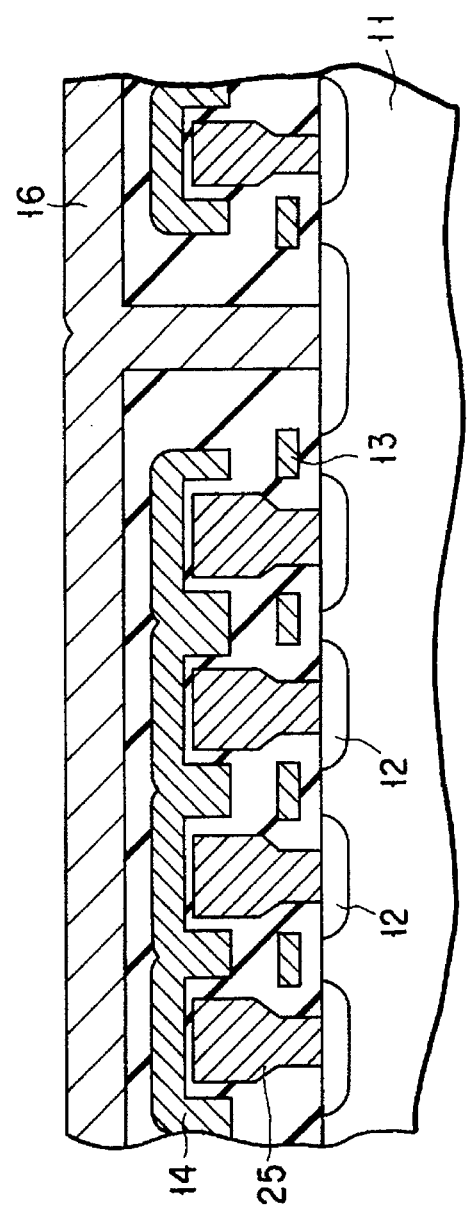

FIGS. 12A and 12B are views for explaining a DRAM according to a fourth embodiment of the present invention. Of these figures, FIG. 12A is a plan view of the element structure of the DRAM and FIG. 12B is a cross-sectional view taken along line 12B—12B of FIG. 12A. Since the circuit diagram of the DRAM is the same as that of the first embodiment, as shown in FIG. 3, it is omitted.

The fourth embodiment is directed to a NAND type DRAM including a plurality of memory cells connected in series, and these memory cells are stack cells each constituted of three-layered polysilicon layer. In this embodiment, the number of the series-connected memory cells is four but can be changed when the need arises.

In each of the stack cells, a columnar storage node 25 is formed on a diffusion layer 12, and a plate electrode 14 is formed on the node 25. The cell structure of the fourth embodiment differs from that of the first embodiment, but the operations of these embodiments are the same. The signal amplitude is two times as large as that of the conventional case, and the cell capacitance Cs can be made smaller than the conventional one. The DRAM can be operated without boosting the word lines, no booster circuits are unnecessary, and a gate insulation film Tox can be thinned. As a result, the manufacturing process can be simplified and the manufacturing steps can be reduced.

As in the first to third embodiments, since complementary data are read out from adjacent bit lines, plate noise is offset. The noise margin can thus be enlarged in the DRAM.

In the fourth embodiment, too, the required number of memory cells is twice as many as that in the conventional case. The area of four-NAND cell of three-layered polysilicon layer is 4.5 F$^2$ and, even if it is doubled, the area is 9 F$^2$.

This area is not so larger than that (8 $F^2$) of a general-purpose memory cell, and the area of the memory cell per signal amplitude is decreased.

FIFTH EMBODIMENT

FIGS. 13A and 13B are views for explaining a DRAM according to a fifth embodiment of the present invention. Of these figures, FIG. 13A is a plan view of the element structure of the DRAM and FIG. 13B is a cross-sectional view taken along line 13B—13B of FIG. 13A. Since the circuit diagram of the DRAM is the same as that of the second embodiment, as shown in FIG. 7, it is omitted.

The fifth embodiment is directed to a NAND type DRAM using one of the memory cells of the fourth embodiment, that is, a general-purpose memory cell. As in the fourth embodiment, the memory cell is a folded bit line type stack cell formed of three-layered polysilicon layer. In the fifth embodiment, element isolation is performed by a transistor 21 whose gate is set to Vss.

Complementary data are written to cells C0 and C0', and an operation of reading the data out of the cells is the same as that in the first embodiment. The signal amplitude is also twice as large as that in the case of the conventional reference potential. The advantages of the fourth embodiment are all applicable to the fifth embodiment.

In the fifth embodiment, too, the required number of memory cells is two times as many as that in the conventional case. Since the area of a one-NAND cell 6 is $F^2$ the area of the memory cells of the fifth embodiment is $12F^2$. This area is not so larger than the area (8 $F^2$) of a general-purpose memory cell, and the area of the memory cells per signal amplitude is decreased.

SIXTH EMBODIMENT

Figure 14A:
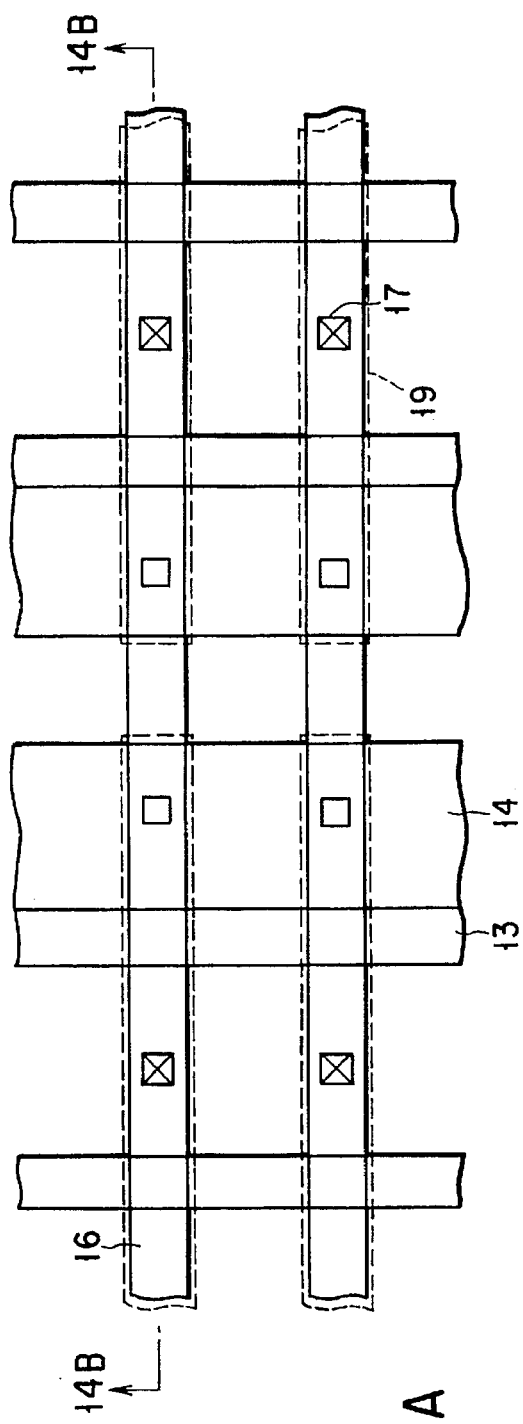
FIGS. 14A and 14B are views of the element structure of a DRAM according to the sixth embodiment.
Figure 14B:
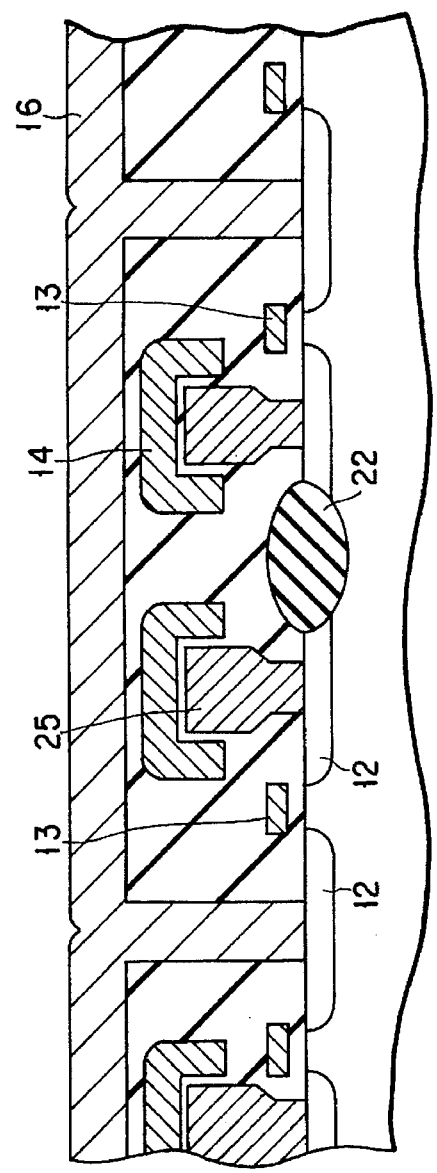

FIGS. 14A and 14B are views for explaining a DRAM according to a sixth embodiment of the present invention. Of these figures, FIG. 14A is a plan view of the element structure of the DRAM and FIG. 14B is a cross-sectional view taken along line 14B—14B of FIG. 14A. Since the circuit diagram of the DRAM is the same as that of the third embodiment, as shown in FIG. 9, it is omitted.

In the sixth embodiment, the element isolation of the fifth embodiment is performed by an element isolation insulative film 22 using a method other than the transistor, e.g., LOCOS. In this embodiment, too, a folded bit line type stack cell formed of three-layered polysilicon layer is employed, and data read out of the bit lines BL and $\overline{BL}$ after one word line rises, are complementary to each other.

Complementary data are written to cells C0 and C0', and an operation of reading the data out of the cells is the same as that in the first embodiment. The signal amplitude is also twice as large as that in the case of the conventional reference potential. The advantages of the fourth embodiment are all applicable to the fifth embodiment.

In the sixth embodiment, too, the required number of memory cells is two times as many as that in the conventional case. Since the area of a one-NAND cell is 6 $F^2$, the area of the memory cells of the sixth embodiment is 12 $F^2$. As illustrated in FIGS. 15A and 15B, in place of separated plate electrodes 14, a single plate electrode 14 can be formed over the element isolation insulative film 22 and may be common to right and left cells. FIG. 15B is a cross-sectional view taken along line 15B—15B of FIG. 15A.

SEVENTH EMBODIMENT

Figures 16A, 16B:
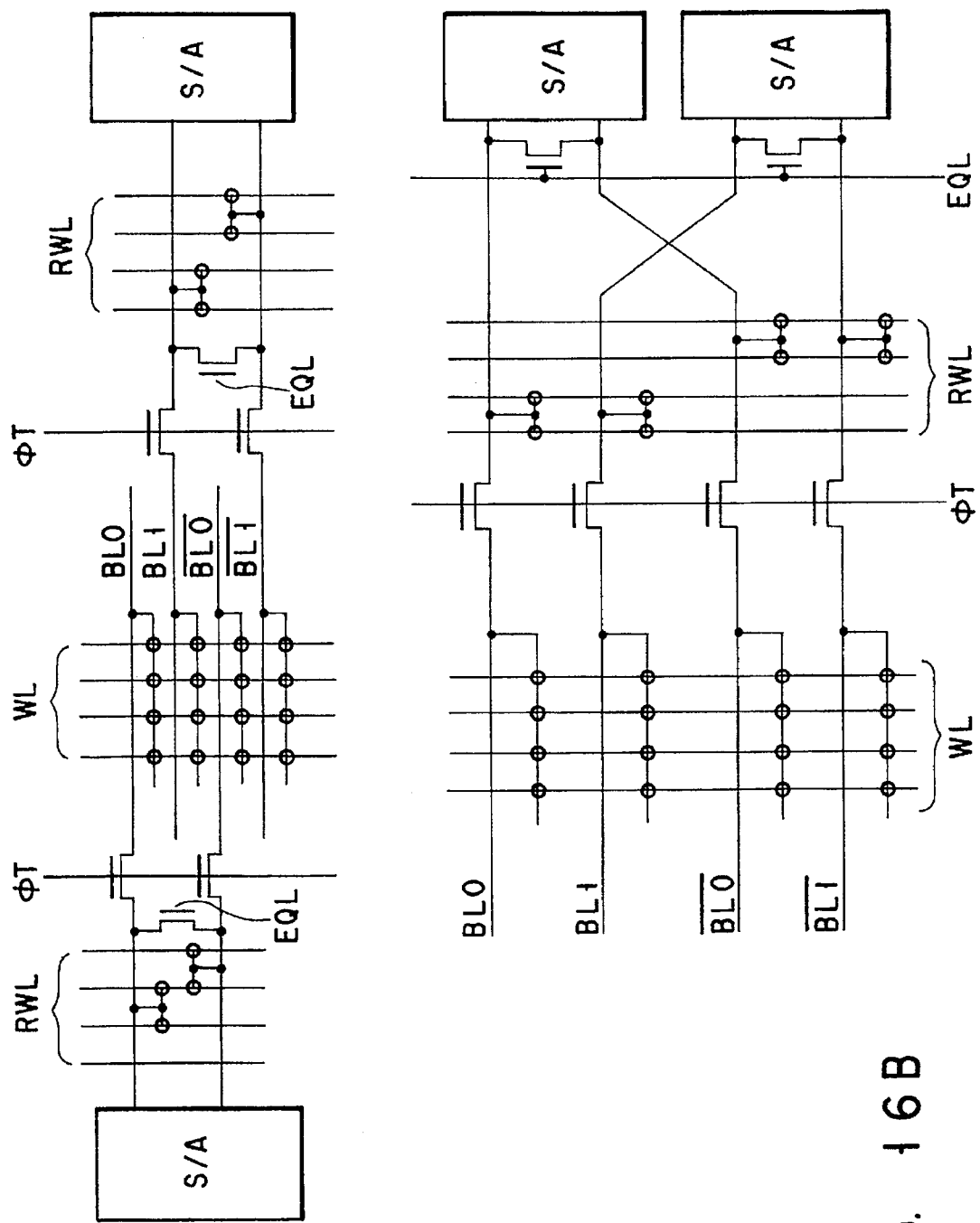
FIGS. 16A and 16B is a circuit diagram of a DRAM according to the seventh (tenth) embodiment of the present invention.

FIGS. 16A, 16B, 17A and 17B are views for explaining a DRAM according to a seventh embodiment of the present invention. Of these figures, FIGS. 16A and 16B are circuit diagrams of the DRAM, FIG. 17A is a plan view of the element structure of the DRAM, and FIG. 17B is a cross-sectional view taken along line 17B—17B of FIG. 17A.

In the seventh embodiment, the bit lines BL and $\overline{BL}$ of the first embodiment are arranged alternately and, in other words, one of bit line pairs is interposed between other bit line pairs. As shown in FIGS. 16A and 16B, sense amplifiers S/A can be provided on both sides or one side of the circuit. When they are provided on one side of the circuit, it is desirable to cross one of bit line pairs and one of other bit line pairs since coupling buses between the bit lines are decreased. If the bit lines BL and $\overline{BL}$ are arranged alternately, the present invention is not limited to the circuit arrangement shown in FIG. 16A or 16B.

As in the first embodiment, complementary cell data are read out from the bit lines BL and $\overline{BL}$. Since the operation of the seventh embodiment is the same as that of the first embodiment, the signal amplitude is twice, and plate noise is offset, thereby increasing in noise margin. In the seventh embodiment, the cell area is large with a value of 17 $F^2$, but the cell size per signal amplitude can be reduced to about 80% of the size of the conventional memory cell of 12 $F^2$.

EIGHTH EMBODIMENT

Figure 18A:
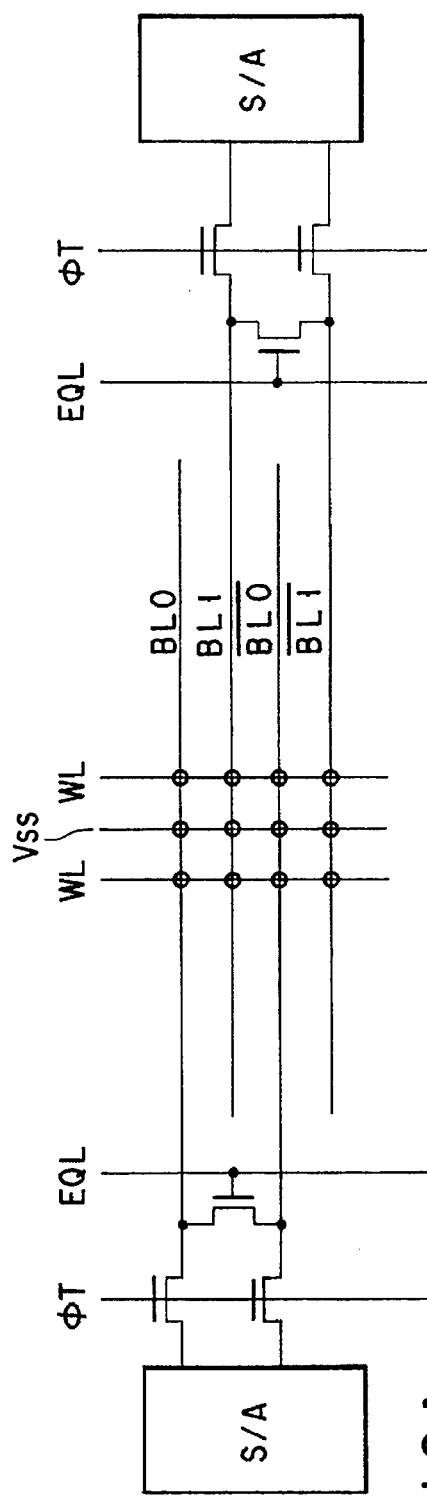
FIGS. 18A and 18B are circuit diagrams of a DRAM according to the eighth and eleventh embodiments of the present invention.
Figure 18B:
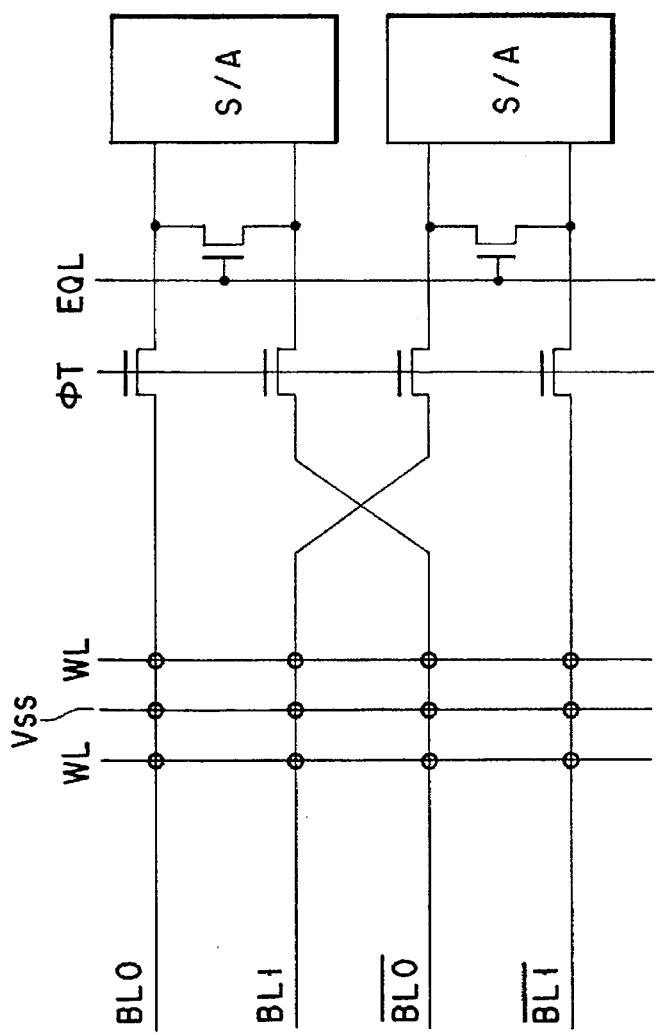
Figures 19A, 19B:
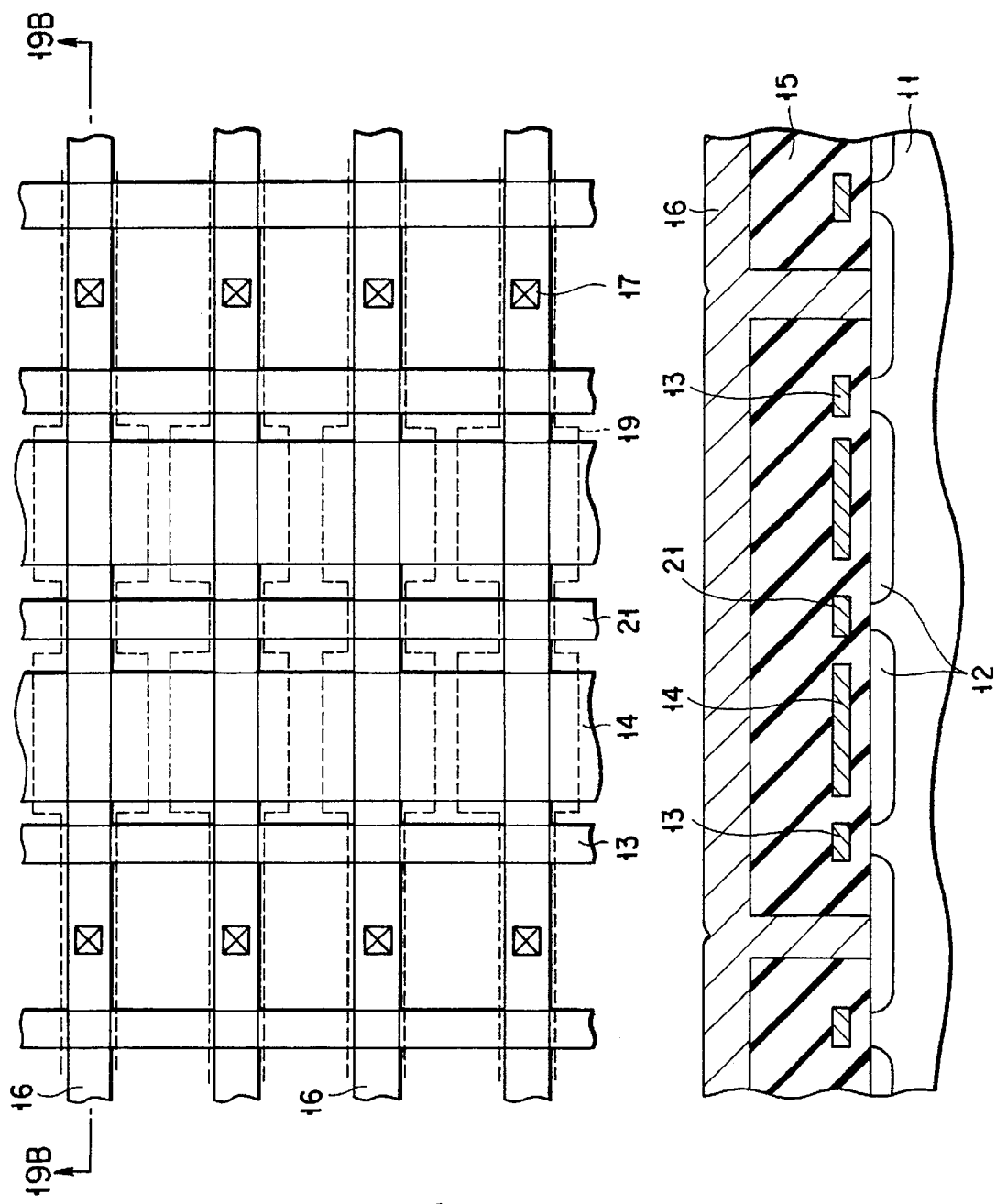
FIGS. 19A and 19B are views of the element structure of the DRAM shown in FIGS. 18A and 18B.

FIGS. 18A, 18B, 19A and 19B are views for explaining a DRAM according to an eighth embodiment of the present invention. Of these figures, FIGS. 18A and 18B are circuit diagrams of the DRAM, FIG. 19A is a plan view of the element structure of the DRAM, and FIG. 19B is a cross-sectional view taken along line 19B—19B of FIG. 19A.

In the eighth embodiment, the bit lines BL and $\overline{BL}$ of the second embodiment are arranged alternately. As shown in FIGS. 18A and 18B, sense amplifiers S/A can be provided on both sides or one side of the circuit. If the bit lines BL and $\overline{BL}$ are arranged alternately, the present invention is not limited to the circuit arrangement shown in FIG. 18A or 18B.

As in the first embodiment, complementary cell data are read out from the bit lines BL and $\overline{BL}$. Since the operation of the eighth embodiment is the same as that of the second embodiment, the signal amplitude is twice, and plate noise is offset, thereby increasing in noise margin. Furthermore, the memory cell size per signal amplitude can be decreased.

NINTH EMBODIMENT

FIGS. 20A, 20B, 21A and 21B are views for explaining a DRAM according to a ninth embodiment of the present invention. Of these figures, FIGS. 20A and 20B are circuit diagrams of the DRAM, FIG. 21A is a plan view of the element structure of the DRAM, and FIG. 21B is a cross-sectional view taken along line 21B—21B of FIG. 21A.

In the ninth embodiment, the bit lines BL and $\overline{BL}$ of the third embodiment are arranged alternately. As shown in FIGS. 20A and 20B, sense amplifiers S/A can be provided on both sides or one side of the circuit. If the bit lines BL and $\overline{BL}$ are arranged alternately, the present invention is not limited to the circuit arrangement shown in FIG. 20A or 20B.

As in the first embodiment, complementary cell data are read out from the bit lines BL and $\overline{BL}$ Since the operation of the ninth embodiment is the same as that of the third embodiment, the signal amplitude is twice, and plate noise is offset, thereby increasing in noise margin. Moreover, as shown in FIGS. 22A and 22B, a single plate electrode 14 can be formed over an element isolation insulative film 22 and may be common to right and left cells. FIG. 22B is a cross-sectional view taken along line 22B—22B of FIG. 22A.

TENTH EMBODIMENT

FIGS. 23A and 23B are views for explaining a DRAM according to a tenth embodiment of the present invention. Of these figures, FIG. 23A is a plan view of the element structure of the DRAM and FIG. 23B is a cross-sectional view taken along line 23B—23B of FIG. 23A. Since the circuit diagram of the DRAM is the same as that of the seventh embodiment, as shown in FIGS. 16A and 16B, it is omitted.

In the tenth embodiment, the bit lines BL and $\overline{BL}$ of the fourth embodiment are arranged alternately. As shown in FIGS. 16A and 16B, sense amplifiers S/A can be provided on both sides or one side of the circuit. If the bit lines BL and $\overline{BL}$ are arranged alternately, the present invention is not limited to the circuit arrangement shown in FIG. 16A or 16B.

As in the first embodiment, complementary cell data read out from the bit lines BL and $\overline{BL}$. Since the operation of the tenth embodiment is the same as that of the fourth embodiment, the signal amplitude is twice, and plate noise is offset, thereby increasing in noise margin.

ELEVENTH EMBODIMENT

Figures 24A, 24B:
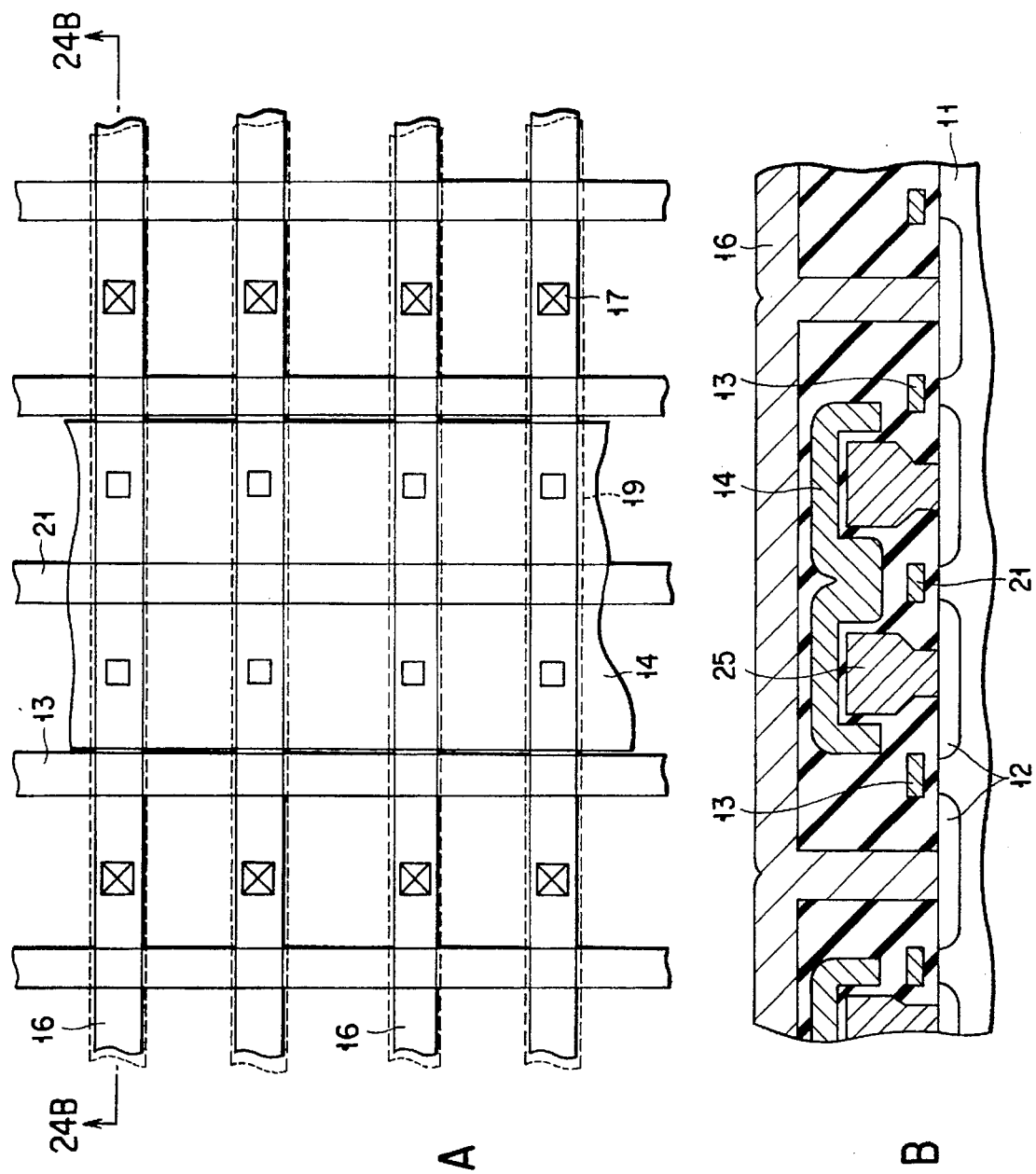
FIGS. 24A and 24B are views of the element structure of a DRAM according to an eleventh embodiment of the present invention.

FIGS. 24A and 24B are views for explaining a DRAM according to an eleventh embodiment of the present invention. Of these figures, FIG. 24A is a plan view of the element structure of the DRAM and FIG. 24B is a cross-sectional view taken along line 24B—24B of FIG. 24A. Since the circuit diagram of the DRAM is the same as that of the eighth embodiment, as shown in FIGS. 18A and 18B, it is omitted.

In the eleventh embodiment, the bit lines BL and $\overline{BL}$ E of the fifth embodiment are arranged alternately. As shown in FIGS. 18A and 18B, sense amplifiers S/A can be provided on both sides or one side of the circuit. If the bit lines BL and $\overline{BL}$ are arranged alternately, the present invention is not limited to the circuit arrangement shown in FIG. 18A or 18B.

As in the first embodiment, complementary cell data are read out from the bit lines BL and $\overline{BL}$. Since the operation of the eleventh embodiment is the same as that of the fifth embodiment, the signal amplitude is twice, and plate noise is offset, thereby increasing in noise margin.

TWELVE EMBODIMENT

Figures 25A, 25B:
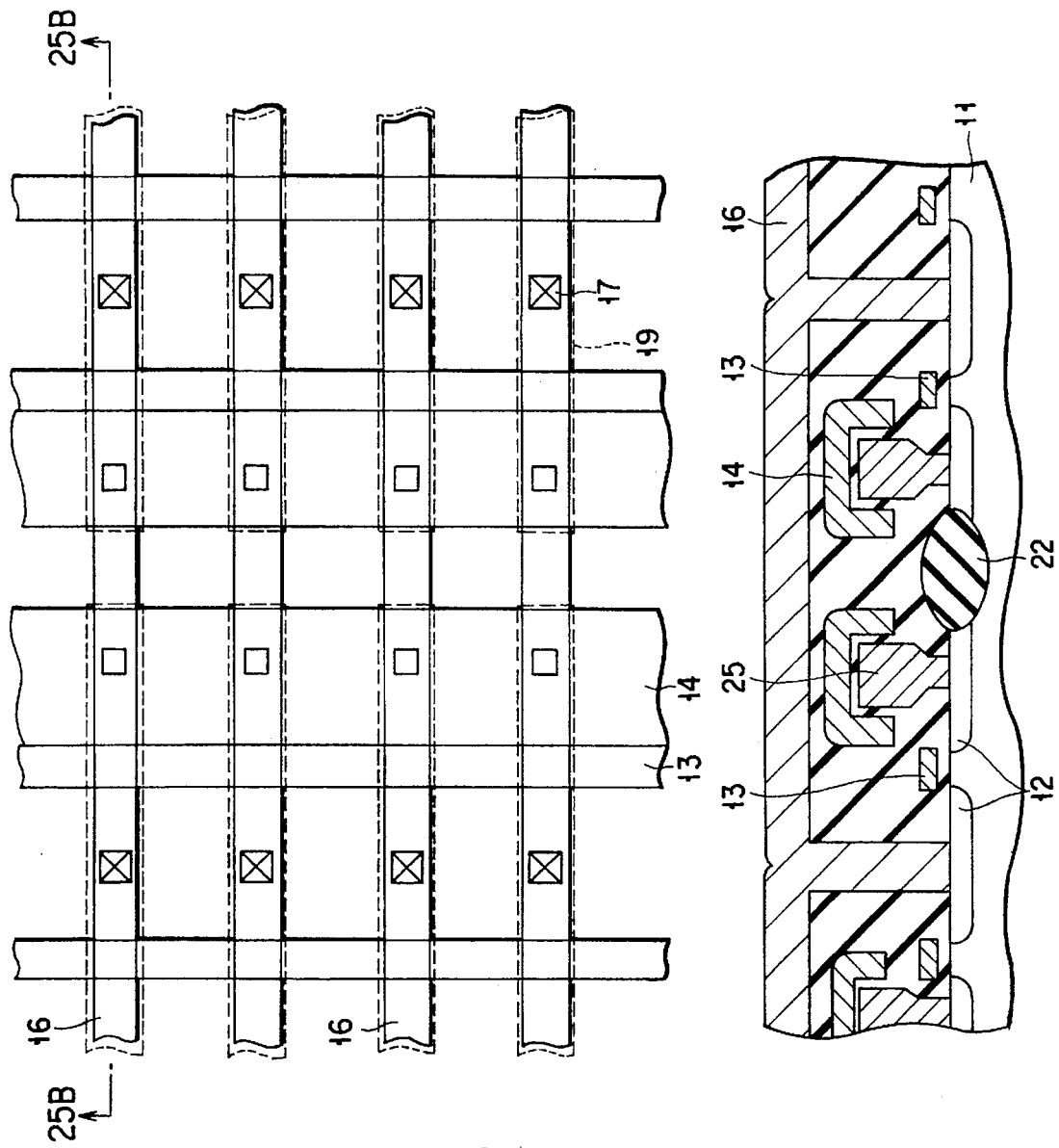
FIGS. 25A and 25B are views of the element structure of a DRAM according to a twelfth embodiment of the present invention.

FIGS. 25A and 25B are views for explaining a DRAM according to a twelfth embodiment of the present invention. Of these figures, FIG. 25A is a plan view of the element structure of the DRAM and FIG. 25B is a cross-sectional view taken along line 25B—25B of FIG. 25A. Since the circuit diagram of the DRAM is the same as that of the eleventh embodiment, as shown in FIGS. 20A and 20B, it is omitted.

In the twelfth embodiment, the bit lines BL and $\overline{BL}$ of the sixth embodiment are arranged alternately. As shown in FIGS. 20A and 20B, sense amplifiers S/A can be provided on both sides or one side of the circuit. If the bit lines BL and $\overline{BL}$ are arranged alternately, the present invention is not limited to the circuit arrangement shown in FIG. 20A or 20B. As illustrated in FIGS. 26A and 26B, a single plate electrode 14 can be formed over an element isolation insulative film 22.

As in the first embodiment, complementary cell data are read out from the bit lines BL and $\overline{BL}$. Since the operation of the twelfth embodiment is the same as that of the sixth embodiment, the signal amplitude is twice, and plate noise is offset, thereby increasing in noise margin.

THIRTEENTH EMBODIMENT

FIGS. 27A and 27B are views for explaining a DRAM according to a thirteenth embodiment of the present invention. Of these figures, FIG. 27A is a plan view of the element structure of the DRAM and FIG. 27B is a cross-sectional view taken along line 27B—27B of FIG. 27A. Since the circuit diagram of the DRAM is the same as that of the eleventh embodiment, as shown in FIG. 7, it is omitted.

In the thirteenth embodiment, the memory cell of the second embodiment is formed as a trench cell of single-layered polysilicon layer. As shown in FIGS. 27A and 27B, a trench 31 is provided in a substrate 11, and a plate electrode 34 is buried into the trench gate 31 with a gate insulative film 32 interposed therebetween.

As in the first embodiment, complementary cell data are read out from the bit lines BL and $\overline{BL}$. Since the operation of the thirteenth embodiment is the same as that of the second embodiment, the signal amplitude is twice, and plate noise is offset, thereby increasing in noise margin.

FOURTEENTH EMBODIMENT

FIGS. 28A and 28B are views for explaining a DRAM according to a fourteenth embodiment of the present invention. Of these figures, FIG. 28A is a plan view of the element structure of the DRAM and FIG. 28B is a cross-sectional view taken along line 28B—28B of FIG. 28A. Since the circuit diagram of the DRAM is the same as that of the third embodiment, as shown in FIG. 9, it is omitted.

In the fourteenth embodiment, the memory cell of the third embodiment is formed as a trench cell of single-layered polysilicon layer. As shown in FIGS. 28A and 28B, a trench 31 is provided in a substrate 11, and a plate electrode 34 is buried into the trench gate 31 with a gate insulative film 32 interposed therebetween. The plate electrodes 34 of adjacent trenches 34 are connected to each other.

As in the first embodiment, complementary cell data are read out from the bit lines BL and $\overline{BL}$. Since the operation of the fourteenth embodiment is the same as that of the third embodiment, the signal amplitude is twice, and plate noise is offset, thereby increasing in noise margin.

FIFTEENTH EMBODIMENT

FIGS. 29A and 29B are views for explaining a DRAM according to a fifteenth embodiment of the present invention. Of these figures, FIG. 29A is a plan view of the element structure of the DRAM and FIG. 29B is a cross-sectional view taken along line 29B—29B of FIG. 29A. Since the circuit diagram of the DRAM is the same as that of the second embodiment, as shown in FIG. 7, it is omitted.

In the fifteenth embodiment, the memory cell of the second embodiment is formed as a trench cell of double-layered polysilicon layer.

As in the first embodiment, complementary cell data are read out from the bit lines BL and $\overline{BL}$ Since the operation of the fifteenth embodiment is the same as that of the second embodiment, the signal amplitude is twice, and plate noise is offset, thereby increasing in noise margin.

SIXTEENTH EMBODIMENT

FIGS. 30A and 30B are views for explaining a DRAM according to a sixteenth embodiment of the present invention. Of these figures, FIG. 30A is a plan view of the element structure of the DRAM and FIG. 30B is a cross-sectional view taken along line 30B—30B of FIG. 30A. Since the circuit diagram of the DRAM is the same as that of the third embodiment, as shown in FIG. 9, it is omitted.

In the sixteenth embodiment, the memory cell of the third embodiment is formed as a trench cell of double-layered polysilicon layer.

As in the first embodiment, complementary cell data are read out from the bit lines BL and $\overline{BL}$. Since the operation of the sixteenth embodiment is the same as that of the third embodiment, the signal amplitude is twice, and plate noise is offset, thereby increasing in noise margin.

SEVENTEENTH EMBODIMENT

Figure 31A:
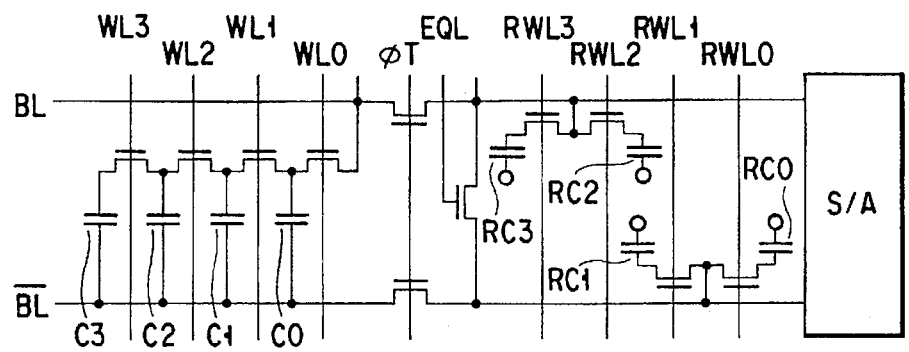
FIGS. 31A and 31B are views of the circuit arrangement and the element structure of a DRAM according to a seventeenth embodiment of the present invention.
Figure 31B:
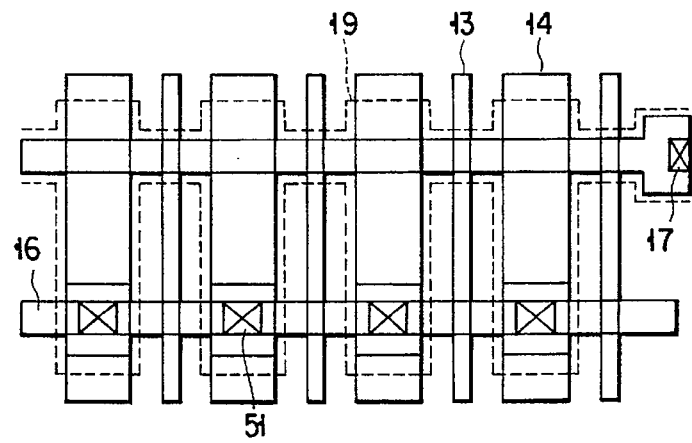

FIGS. 31A and 31B are views for explaining a DRAM according to a seventeenth embodiment of the present invention. Of these figures, FIG. 31A is a circuit diagram of the DRAM and FIG. 31B is a plan view of the element structure thereof.

The seventeenth embodiment is directed to a NAND type DRAM including a plurality of memory cells connected in series, and these memory cells are plane cells each constituted of single-layered polysilicon layer. In this embodiment, the number of the series-connected memory cells is four but can be changed when necessary. The DRAM of the seventeenth embodiment is of a folded bit line type in which a pair of adjacent bit lines BL and $\overline{BL}$ is connected to a sense amplifier S/A, as illustrated in FIG. 31A. A NAND type memory cell unit (NAND cell) having four dynamic type memory cells C0 to C3 connected in series is connected to the bit line BL. A plate electrode of the memory cells C0 to C3 is connected to the bit line $\overline{BL}$.

Data is read out of the sense amplifier S/A and temporarily stored in four register cells RC0 to RC3. The number of the register cells corresponds to that of the series-connected memory cells of each of the NAND cells.

FIG. 31A shows only one bit line pair. It is however needless to say that a large number of bit line pairs are arranged and a sense amplifier S/A is connected to each of the bit line pairs. It is also needless to say that a large number of NAND cells are connected to one bit line.

FIG. 31B illustrates a word line 13, a plate electrode 14, a bit line 16, a bit line contact 17, an element region 19, and a contact between the plate electrode 14 and bit line 16.

The seventeenth embodiment has the advantage wherein since the word line and plate electrode are constituted of the same layer (single-layered polysilicon layer), the number of manufacturing steps can be reduced, and the cell is simple in shape and thus easy to process. An operation of the DRAM of the seventeenth embodiment will now be described in brief.

In FIG. 31A, if the word lines rise in order from the cell nearest to the bit line contact, since the plate of a cell capacitor is connected to the bit line $\overline{BL}$, a cell data of signal amplitude Vs is read out from the bit line BL and that of signal amplitude —Vs is read out from the bit line $\overline{BL}$. These data are amplified by the sense amplifier S/A and written to a register cell. When four cell data are held in the register cell, the word lines rise, while storing the data of the register cell again in the memory cells from the cell farthest from the bit line contact.

When cell data is read out, if the bit line precharge potential is Vcc/2, the potentials BL(H) and BL(L) of the bit lines BL and $\overline{BL}$ are:

$$VBL(H)=(Vcc/2 \cdot CB+Vcc \cdot Cs)/(CB+4Cs) \text{ ps}$$

$$VBL(L)=(Vcc/2 \cdot CB-Vcc \cdot Cs)/(CB+4Cs)$$

The difference in potential (signal amplitude) between the bit lines is given by the following equation:

$$VBL(H)-VBL(L)=2Vcc \cdot Cs/(CB+4Cs)$$

Thus, the signal amplitude of the seventeenth embodiment is four times as large as that of the prior art wherein a reference potential is set at Vcc/2.

If, as described above, the larger signal amplitude is obtained, the following advantages can be obtained. First, the cell capacitance Cs can be made smaller than the conventional one. Secondly, since data "1" and "0" can be always read out from the bit line pairs with precision without boosting the word lines. Since, therefore, no booster circuit is required, a manufacturing process can be simplified and a gate insulation film Tox can be thinned. Moreover, since no dummy cells are needed, the DRAM is not influenced by any variations in dummy cells.

According to the seventeenth embodiment, the minimum cell size is 17 $F^2$, whereas that of a conventional folded bit line type plane cell formed of single-layered polysilicon layer is 12 $F^2$. However, the signal amplitude is four times as large as that of the conventional cell and, taking into consideration that there are no variations in dummy cells, the signal amplitude is increased four or more times. Consequently, the cell size necessary for obtaining the same amplitude as that of the prior art, has only to be 40% of the conventional cell size.

EIGHTEENTH EMBODIMENT

Figure 32A:
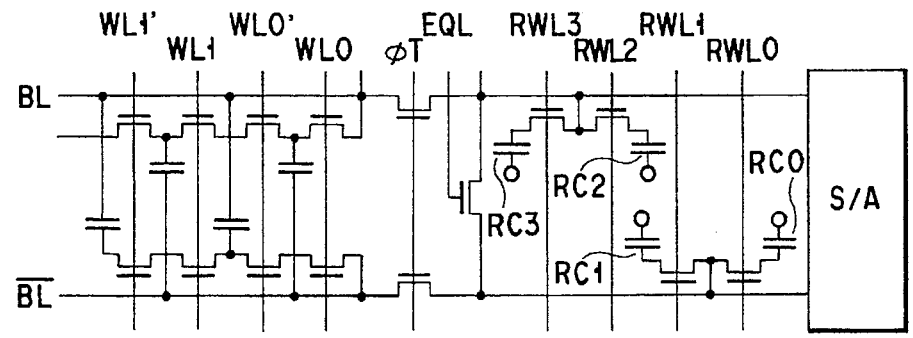
FIGS. 32A and 32B are views of the circuit arrangement and the element structure of a DRAM according to an eighteenth embodiment of the present invention.
Figure 32B:
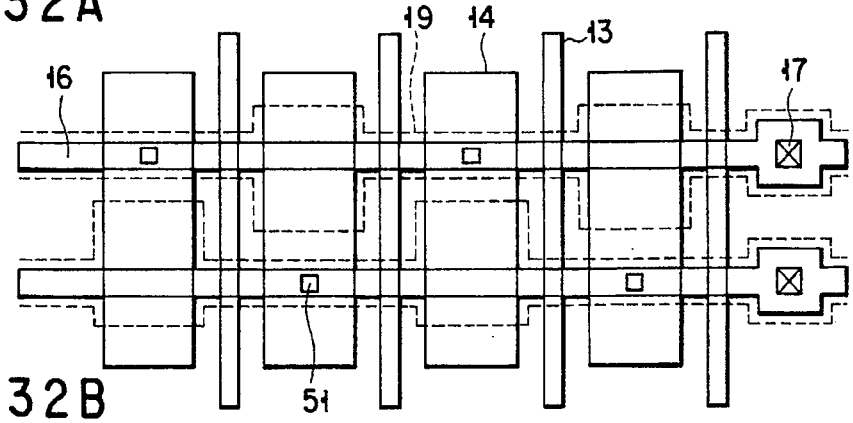

FIGS. 32A and 32B are views for explaining a DRAM according to an eighteenth embodiment of the present invention. Of these figures, FIG. 32A is a circuit diagram of the DRAM and FIG. 32B is a plan view of the element structure thereof.

In this embodiment, a folded bit line type plane cell formed of single-layered polysilicon layer is employed as the seventh embodiment. The element isolation of the eighteenth embodiment is performed by the transistor whose gate is connected to Vss or LOCOS.

In the eighteenth embodiment, since contacts 51 between plate electrodes and bit lines are arranged in a staggered manner, the memory cells can be arranged closely toward the bit lines. Since the cell is formed of single-layered polysilicon layer, it is simple in shape and easy to process.

The cell data reading operation of the eighteenth embodiment is the same as that of the seventeenth embodiment. The signal amplitude is also four times as large as that in the case of the conventional reference potential. Therefore, the advantages of the seventeenth embodiment are all applicable to the eighteenth embodiment.

According to the eighteenth embodiment, the minimum cell size is 17 $F^2$, whereas that of a conventional folded bit line type plane cell formed of single-layered polysilicon layer is 12 $F^2$. However, the signal amplitude is four times as large as that of the conventional cell and, taking into consideration that there are no variations in dummy cells, the signal amplitude is increased four or more times. Consequently, the cell size necessary for obtaining the same amplitude as that of the prior art, has only to be 40% of the conventional cell size.

NINETEENTH EMBODIMENT

FIGS. 34A and 34B are views for explaining a DRAM according to a nineteenth embodiment of the present invention. Of these figures, FIG. 34A is a circuit diagram of the DRAM and FIG. 34B is a plan view of the element structure thereof.

In this embodiment, a normally-on transistor having a low threshold voltage is used for an excess transistor 52 of the eighteenth embodiment. With this configuration, faster reading from/writing to the memory cells can be performed than that of the eighteenth embodiment.

The DRAM of the nineteenth embodiment is also of a folded bit line type in which a plane cell of single-layered polysilicon layer is used, and data read out from bit lines BL and $\overline{BL}$ when one word line rises are complementary to each other. Since the cell is formed of single-layered polysilicon layer, the word lines and plate electrodes are arranged in parallel as shown in FIG. 34B, and the cell is simple in shape and easy to process. Since, moreover, the contacts between the plate electrodes and bit lines are arranged in a staggered manner, the memory cells can be arranged closely toward the bit lines, as shown in FIG. 35.

The cell data reading operation of the nineteenth embodiment is the same as that of the seventeenth embodiment. The signal amplitude is also four times as large as that in the case of the conventional reference potential. Therefore, the advantages of the seventeenth embodiment are all applicable to the nineteenth embodiment.

TWENTIETH EMBODIMENT

FIG. 36 is a circuit diagram showing a DRAM according to a twentieth embodiment of the present invention. In this embodiment, the NAND cell unit connected to the bit line BL and a NAND cell unit connected to the bit line $\overline{BL}$ in the seventeenth embodiment, are stacked one on another.

The cell data reading operation of the twentieth embodiment is the same as that of the seventeenth embodiment. The signal amplitude is also four times as large as that in the case of the conventional reference potential. Therefore, the advantages of the seventeenth embodiment are all applicable to the twentieth embodiment.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
  a memory cell array including NAND type memory cell units arranged in matrix, each unit having a plurality of dynamic type memory cells connected in series;
  a plurality of word lines;
  a plurality of bit lines arranged within said memory cell array, said plurality of bit lines including a plurality of folded bit line pairs, bit lines of said bit folded bit line pairs are arranged one of adjacent to each other and to interpose at least one bit line between said bit line pairs; and
  a plurality of sense amplifiers provided in each of said plurality of bit line pairs, wherein
  said memory cells are provided in positions corresponding to intersections of said bit lines and said word lines, and
  complementary data are respectively written to two memory cells connected to each of said plurality of bit line pairs and one word line, and said two memory cells store one-bit data.

2. The semiconductor memory device according to claim 1, wherein said plurality of memory cells in which are plane cells, plate electrodes of capacitors of said plane cells and said word lines are formed of a same polysilicon layer.

3. The semiconductor memory device according to claim 1, further comprising isolation regions in a bit line direction, said regions are one of the transistor and LOCOS.

4. The semiconductor memory device according to claim 1, wherein a voltage which is one of equal to and lower than a power supply voltage is applied to the word line when data is one of read out from said memory cells and when data is written thereto.

5. The semiconductor memory device according to claim 1, further comprising a plurality of register cells for temporarily storing data of said memory cells.

6. The semiconductor memory device according to claim 5, wherein the data of said memory cells are amplified and written into said plurality of register cells in order, from a closet memory cell to a farthest memory cell against a bit line contact in the NAND type memory cell unit, and the data temporarily stored in said plurality of register cells are restored in said memory cells.

7. The semiconductor memory device according to claim 5, wherein a number of said plurality of register cells is the same as that of series-connected said memory cells of said NAND type memory cell unit.

8. A semiconductor memory device comprising:
  a memory cell array including NAND type memory cell units arranged in matrix, each unit has a plurality of dynamic type memory cells connected in series, said plurality of dynamic type memory cells including transistors and capacitors;
  a plurality of bit lines arranged within said memory cell array, said plurality of bit lines including a plurality of folded bit line pairs, bit lines of said folded bit line pairs are arranged one of adjacent to each other and to interpose at least one bit line between said bit line pairs each of which has a first bit line and a second bit line; and
  a plurality of sense amplifiers provided in said bit line pairs, wherein
  said first bit line is connected to the capacitors and said second bit line is connected to the transistors,
  data is read out to the first and second bit lines from a selected memory cell as a one bit data.

9. The semiconductor memory device according to claim 8, wherein ones of the transistors and the capacitors of said plurality of memory cells are alternately connected to said first bit line and the others of the transistors and the capacitors of said memory cells are alternately connected to said second bit lines.

10. The semiconductor memory device according to claim 8, wherein said NAND type memory cell units each include a switching transistor and a normally-on transistor having a low threshold value, and the switching transistor and the normally-on transistor are selected by a single word line.

11. The semiconductor memory device according to claim 8, wherein said plurality of memory cells in which are plane cells, plate electrodes of capacitors of said plane cells and said word lines are formed of a same polysilicon layer.

12. The semiconductor memory device according to claim 8, further comprising isolation regions in a bit line direction are provided, said regions are one of the transistor and LOCOS.

13. The semiconductor memory device according to claim 8, wherein a voltage which is one of equal to and lower than a power supply voltage is applied to the word line when data is one of read out from said memory cells and when data is written thereto.

14. The semiconductor memory device according to claim 8, further comprising a plurality of register cells for temporarily storing data of said memory cells.

15. The semiconductor memory device according to claim 14, wherein the data of said memory cells are amplified and written into said plurality of register cells in order, from a closet memory cell to a farthest memory cell against a bit line contact in the NAND type memory cell unit, and the data temporarily stored in said plurality of register cells are restored in said memory cells.

16. The semiconductor memory device according to claim 14, wherein a number of said plurality of register cells is the same as that of series-connected said memory cells of said NAND type memory cell unit.

* * * * *